United States Patent
Hayakawa

(10) Patent No.: US 7,755,075 B2
(45) Date of Patent: Jul. 13, 2010

(54) PHASE-CHANGE MEMORY DEVICE WITH MINIMIZED REDUCTION IN THERMAL EFFICIENCY AND METHOD OF MANUFACTURING THE SAME

(75) Inventor: Tsutomu Hayakawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 219 days.

(21) Appl. No.: 11/678,484

(22) Filed: Feb. 23, 2007

(65) Prior Publication Data
US 2008/0042118 A1  Feb. 21, 2008

(30) Foreign Application Priority Data
Feb. 25, 2006  (JP) .............................. 2006-049409

(51) Int. Cl.
*H01L 47/00* (2006.01)
(52) U.S. Cl. .................. 257/4; 257/2; 257/3; 257/5; 257/48; 257/E29.284
(58) Field of Classification Search ............... None
See application file for complete search history.

(56) References Cited

U.S. PATENT DOCUMENTS 4,449,039 A * 5/1984 Fukazawa et al. ........... 219/553
7,417,245 B2 * 8/2008 Happ et al. .................. 257/2
7,452,811 B2 * 11/2008 Choi et al. .................. 438/681
2007/0148933 A1 * 6/2007 Lee et al. .................... 438/584
2008/0048166 A1 * 2/2008 Takaura et al. ............... 257/2

FOREIGN PATENT DOCUMENTS

JP  2003-332529 A  11/2003

* cited by examiner

*Primary Examiner*—Evan Pert
*Assistant Examiner*—Scott R Wilson
(74) *Attorney, Agent, or Firm*—Sughrue Mion, PLLC

(57) ABSTRACT

A phase-change memory device has a different-material contact plug having a first electrically conductive material plug made of a first electrically conductive material, and a second electrically conductive material plug made of a second electrically conductive material having a specific resistance smaller than the first electrically conductive material, the first electrically conductive material plug and the second electrically conductive material plug being buried in a common contact hole. The different-material contact plug is effective for reducing the radiation of heat from a contact plug beneath a phase-change layer. The phase-change memory device also includes an extension electrode layer held in contact with a portion of the bottom surface of the phase-change layer in an area displaced off a position directly above a contact surface through which the phase-change layer and the heater electrode contact each other. The extension electrode layer reduces the radiation of heat from an electrode above the phase-change layer.

16 Claims, 22 Drawing Sheets

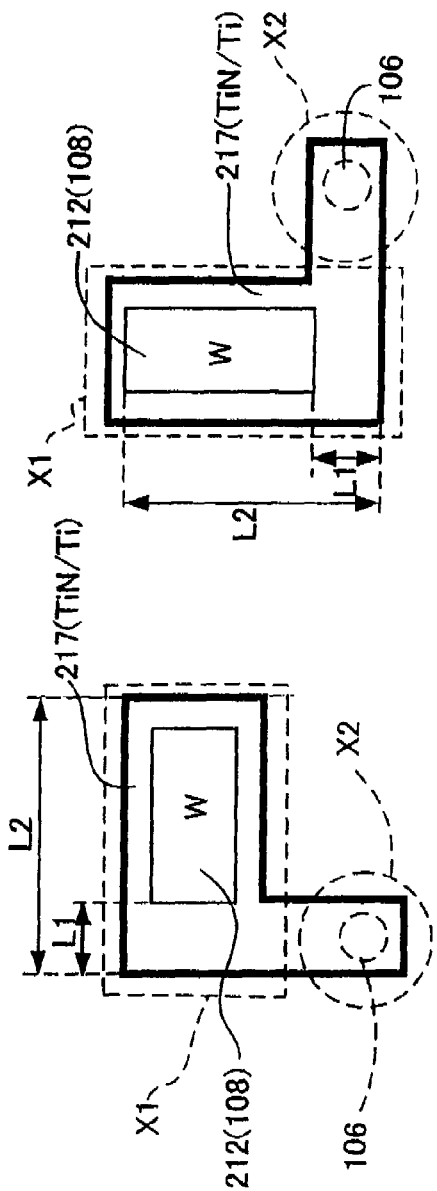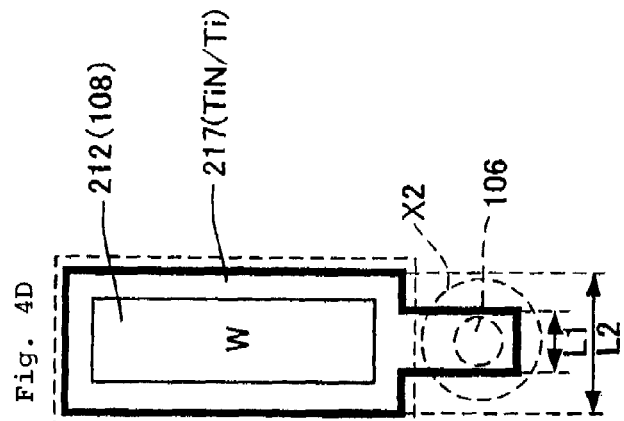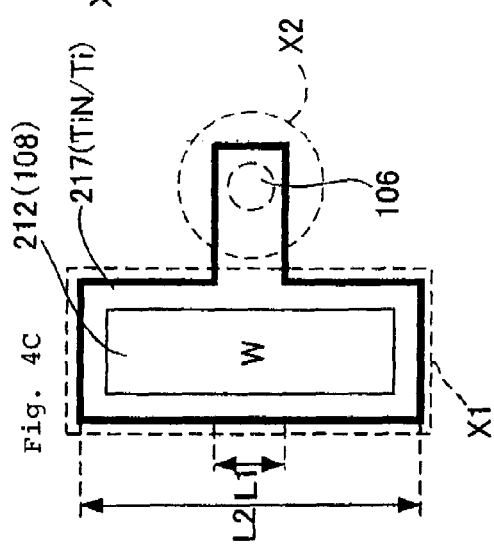

PHASE-CHANGE MEMORY DEVICE WITH MINIMIZED REDUCTION IN THERMAL EFFICIENCY AND METHOD OF MANUFACTURING THE SAME

BACKGROUND OF THE INVENTION

1. Field of the Invention

The present invention relates to a phase-change memory device and a method of manufacturing the same.

2. Description of the Related Art

Phase-change memory devices are memory devices that employ in their memory cells a phase-change layer (a chalcogenide semiconductor thin film or the like) whose electrical resistance changes depending on its crystalline state. Chalcogenide semiconductors refer to amorphous semiconductors including chalcogen elements.

Chalcogen elements include S (Sulfur), Se (Selenium), and Te (Tellurium) in group 6 in the periodic table. Chalcogenide semiconductors find use in generally two fields: optical disks and electric memories. Chalcogenide semiconductors used in the field of electric memories include GeSbTe (hereinafter referred to as "GST") which is a compound of Ge (Germanium), Te (Tellurium), and Sb (Antimony), AsSbTe, SeSbTe, etc.

A chalcogenide semiconductor may take one of two stable states at one time, i.e., an amorphous semiconductor state and a crystalline state. For switching from the amorphous state to the crystalline state, the chalcogenide semiconductor needs to be supplied with heat in excess of an energy barrier. The amorphous state exhibits a higher electrical resistance corresponding to a digital value "1" and the crystalline state exhibits a lower electrical resistance corresponding to a digital value "0". This allows the chalcogenide semiconductor to store digital information. The amount of current flowing through the chalcogenide semiconductor or a voltage drop across the chalcogenide semiconductor is detected to determine whether the information stored in the chalcogenide semiconductor is "1" or "0".

As heat supplied to cause a phase change in the chalcogenide semiconductor, Joule heat is used. Specifically, pulses having different peak values and different pulse durations are applied to the chalcogenide semiconductor to generate Joule heat in the vicinity of contact surfaces of the electrodes and the chalcogenide semiconductor, and the Joule heat causes a phase change.

More specifically, after the chalcogenide semiconductor is supplied with heat at a temperature near its melting point, when the chalcogenide semiconductor is quickly cooled, it switches into the amorphous state. After the chalcogenide semiconductor is supplied with heat at a crystallizing temperature lower than the melting point for a long period of time, when the chalcogenide semiconductor is cooled, it switches into the crystalline state. For example, after the GST is supplied with heat at a temperature near the melting point (about 610° C.) for a short period of time (1 through 10 ns), when the GST is quickly cooled for about 1 ns, it switches into the amorphous state. After the GST is supplied with heat at a crystallizing temperature (about 450° C.) for a long period of time (30 through 50 ns), when the GST is cooled, it switches into the crystalline state.

Switching from the amorphous state into the crystalline state is referred to as "set" (crystallizing process), and a pulse applied to set the chalcogenide semiconductor is referred to as "set pulse". Herein, It is assumed that the minimum temperature (crystallizing temperature) required to crystallize the chalcogenide semiconductor is represented by Tc, and the minimum time (crystallizing time) required to crystallize the chalcogenide semiconductor is represented by tr. Conversely, switching from the crystalline state into the amorphous state is referred to as "reset" (amorphizing process), and a pulse applied to reset the chalcogenide semiconductor is referred to as "reset pulse". Heat applied to the chalcogenide semiconductor for resetting the chalcogenide semiconductor is heat at a temperature near the melting point Tm. After the chalcogenide semiconductor is melted, it is quenched.

FIGS. 22A and 22B of the accompanying drawings are diagrams illustrating a basic structure of a phase-change memory device and the manner in which the phase-change memory device is set and reset.

As shown in FIG. 22A, the phase-change memory device is of a basic structure having chalcogenide semiconductor layer (phase-change layer) 46 sandwiched between upper and lower electrodes 48, 42. Lower electrode 42 is mounted on substrate 40 and isolated from upper electrode 48 by electric insulating film 44. Upper electrode 48 is connected to terminal P to which a set pulse will be applied. Lower electrode 42 is connected to ground (reference potential).

As shown in FIG. 22B, the phase-change memory device shown in FIG. 22A is equivalent to resistor R1. The resistance of resistor R1 varies depending on whether chalcogenide semiconductor layer 46 is in the amorphous state or the crystalline state. As shown in a left portion of FIG. 22B, set pulse S1, i.e., a pulse having a peak value in excess of threshold value Vth, reset pulse S2, i.e., a pulse having a peak value greater than set pulse S1 and a shorter pulse duration than set pulse S1, and reading pulse S3, i.e., a pulse having a peak value smaller than threshold value Vth and a longer pulse duration than set pulse S1, are selectively applied to terminal P. Threshold value Vth represents a lower-limit voltage at which Joule heat required for crystallization can be generated.

The voltage value of set pulse S1 is in excess of threshold value Vth, and the pulse duration of set pulse S1 is equal to or longer than crystallizing time tr, i.e., the minimum time required to crystallize the chalcogenide semiconductor. The temperature rise due to the Joule heat is considerably lower than melting point Tm and higher than the minimum temperature required for crystallization, i.e., crystallizing temperature Tc.

Reset pulse S2 has a peak value much higher than threshold value Vth and a sufficiently small pulse duration. The temperature rise due to the Joule heat is in excess of melting point Tm of the chalcogenide semiconductor. The temperature falls from the peak value to crystallizing temperature Tc within a sufficiently short time. Therefore, after the chalcogenide semiconductor is melted, it is quenched back to the amorphous state.

Reading pulse S3 is a pulse for measuring the resistance value of resistor R1, and has no effect whatsoever on the state of the chalcogenide semiconductor.

The phase-change memory device shown in FIGS. 22A through 22B has a circuit arrangement for supplying set pulse S1 and reset pulse S2 from terminal P. However, the phase-change memory device may have a circuit arrangement as shown in FIG. 23 of the accompanying drawings.

FIG. 23 is a circuit diagram of a circuit arrangement of the phase-change memory device.

In FIG. 23, resistor R1 is equivalent to the phase-change memory device and has one end connected to terminal P that is connected to power supply potential VDD. Resistor R1 has the other end connected to size-adjusted MOS transistors M1, M2, M3 having respective gates connected to set pulse terminal P1, reset pulse terminal P2, and reading pulse terminal P3, respectively.

Set, reset, and reading pulse signals are selectively applied to set pulse terminal P1, reset pulse terminal P2, and reading pulse terminal P3, respectively, to select which one of MOS transistors M1, M2, M3 is to be turned on, and to control the turn-on time of a selected one of MOS transistors M1, M2, M3. In this manner, the phase-change memory device operates in set, reset, and reading modes.

FIG. 24 of the accompanying drawings is a circuit diagram showing the manner in which a phase-change memory device (phase-change memory IC) operates in a reading mode. Those parts shown in FIG. 24 which are identical to those shown in FIGS. 22A through 22D and 23 are denoted by identical reference characters.

In FIG. 24, a word line is represented by W, a ground line by G, a bit line (a pulse input line connected to terminal P for inputting set pulse S1, reset pulse S2, and reading pulse S3) by B, and a resistor, equivalent to the phase-change memory device (comprising chalcogenide semiconductor layer 46) which serves as a memory cell, by R1.

An NMOS transistor (switching device) for selecting the memory cell is represented by M4, a current-to-voltage converting resistor by R2, a sense amplifier by A1, a reference voltage source for sense amplifier A1 by 62, a current flowing through the memory cell in the reading mode by I1, and an output voltage of sense amplifier A1 (sensing output) by Vout.

In a set mode (also in a reset mode and the reading mode), word line W is activated to turn on NMOS transistor M4. Thereafter, one of pulses S1, S2, S3 is supplied from terminal P. In the reading mode, reading pulse S3 is supplied from terminal P.

The resistance of resistor R1 varies and hence the amount of current I1 flowing therethrough varies depending on whether chalcogenide semiconductor layer 46 of the memory cell is in the amorphous state or the crystalline state. By converting the amount of current I1 into a voltage and reading the voltage, it is possible to determine whether information stored in the memory cell is "1" or "0".

FIG. 25 of the accompanying drawings is a cross-sectional view of specific structural details of a memory cell in a phase-change memory device (phase-change memory IC).

In FIG. 25, p-type semiconductor substrate 70 has n-type source layer 71 and n-type drain layer 72 formed therein, and gate electrode 74 connected to word line W is disposed on gate insulating film 73 that is disposed on p-type semiconductor substrate 70.

Interlayer insulating films 75, 79 are disposed on gate insulating film 73. An electrode connected to n-type source layer 71 comprises contact plug 76 extending through interlayer insulating film 75 and gate insulating film 73 and electrode 78 connected to contact plug 76 and comprising a first conductive layer disposed in interlayer insulating film 79. The electrode is connected to ground line G.

Contact plug 77 made of tungsten (W), for example, extends through interlayer insulating film 75 and gate insulating film 73 and is connected to n-type drain layer 72. Contact plug 80 serving as a heater electrode extends through interlayer insulating film 79 and is connected to contact plug 77.

Phase-change layer 82 comprising a chalcogenide semiconductor is disposed on interlayer insulating film 79 with glue layer 81 in the form of a thin metal film being interposed therebetween. Glue layer 81 is interposed to hold phase-change layer 82 and interlayer insulating film 79 closely together because phase-change layer 82 and interlayer insulating film 79 would not adhere closely to each other.

Upper electrode 83 comprising a second conductive layer is disposed on phase-change layer 82 and extends over its upper surface. Interlayer insulating film 84 is disposed on upper electrode 83. Contact plug 85 connected to upper electrode 83 extends through interlayer insulating film 84. Electrode 86 comprising a third conductive layer is disposed on interlayer insulating film 84 and is connected to contact plug 85. Electrode 86 serves as pulse supply terminal P. Contact plug 85 and electrode 86 jointly make up a contact electrode.

Phase-change layer 82 includes an area surrounded by dotted line X, where a phase change occurs. Electrode 80 made of titanium nitride (TiN) is embedded in interlayer insulating film 79. Electrode 80 constricts a current flowing through phase-change layer 82 to increase the current density for efficiently generating Joule heat in phase-change region X. Therefore, electrode 80 is called a heater electrode (heating electrode), and will hereinafter be referred to as heater electrode 80.

The current density of the current flowing through phase-change layer 82 increases and the generated Joule heat increases as the area of contact between heater electrode 80 and phase-change layer 82 decreases. Consequently, the area of contact between heater electrode 80 and phase-change layer 82 is set to a sufficiently small area, e.g., an area determined by photolithographically designed minimum dimensions.

The phase-change memory device with the phase-change layer sandwiched between the upper and lower electrodes, as shown in FIG. 22A, is disclosed in JP 2003-332529A, for example. The publication also discloses that the lower electrode (heater electrode) has a pointed end to minimize the area of contact between the electrode and the phase-change layer in order to prevent thermal efficiency from being lowered in the phase-change process of the phase-change memory device.

The inventor of the present invention has studied the phase-change memory device shown in FIG. 25 and found that it suffers two disadvantages as described below.

(1) A reduction in thermal efficiency due to heat radiation from the upper electrode:

In the phase-change memory device shown in FIG. 25, heat generated in phase-change region X of phase-change layer 82 is radiated from upper electrode 83, resulting in a reduction in thermal efficiency upon a phase change, or in particular, resulting in a reduction in thermal efficiency when phase-change layer 82 is reset. In other words, upper electrode 83 which is made of a highly conductive metal, e.g., tungsten (W), functions as a heat sink (heat radiating fin) to lower thermal efficiency.

(2) A reduction in thermal efficiency due to heat radiation from the contact plug:

The phase-change memory device shown in FIG. 25 has a heat radiation route for transmitting the heat generated in phase-change region X of phase-change layer 82 downwardly through heater electrode 80 to contact plug 77 and for radiating the heat from contact plug 77. The heat radiation route occurs necessarily because of the structure of the phase-change memory device.

Specifically, contact plug 77 is made of a material of low resistance, e.g., tungsten (W), for the purpose of reducing the electrical resistance of contact plug 77, and heater electrode 80 is made of a material of high resistance, e.g., titanium nitride (TiN), for the purpose of efficiently generating Joule heat. Since a metal material having a higher electrical conductivity (the reciprocal of electrical resistivity) has a higher thermal conductivity, contact plug 77 having a lower resistance, i.e., a higher electrical conductivity, has a higher thermal conductivity than heater electrode 80 having a higher resistance, i.e., a lower electrical conductivity. Therefore, contact plug 77 functions as a heat sink (heat radiating fin) with good heat radiating capability.

As shown in FIG. 22A, the memory cell of the phase-change memory is of a structure wherein chalcogenide semiconductor layer 46 is sandwiched between upper and lower electrodes 48, 42. Therefore, radiation of heat from the metal layers that exist above and below phase-change region X necessarily occurs.

Such a reduction in thermal efficiency does not pose a significant problem when a single phase-change memory device or a phase-change memory IC having a low degree of integration is made as a prototype. However, it could be a large problem when highly integrated phase-change memory ICs are actually mass-produced according to a microfabrication process.

Specifically, for manufacturing a phase-change memory device having a high storage capacity, it is necessary to reduce the size of a memory cell, and it is important to reduce the reset current, i.e., the current required to shift the phase-change layer from the crystalline state to the amorphous state.

The structure wherein the metal layers above and below the phase-change region functions as a heat sink (heat radiating fin) having good heat radiating capability is responsible for reducing thermal efficiency and preventing the amount of reset current from being reduced.

The invention disclosed in JP 2003-332529A is addressed to heat radiation in the contact interface between the phase-change layer and the heater electrode, and does not refer to or suggest the radiation of heat from the electrode above the phase-change region. The disclosure of the above publication does not refer to or suggest the radiation of heat transferred via the heater electrode through the lower electrode.

Therefore, the disclosure of the above publication does not provide solutions to the above problems. According to the disclosure of the above publication, the end of the heater electrode needs to be pointed at a sharp angle. The need to produce the pointed end of the heater electrode, however, tends to make a method of manufacturing a phase-change memory device complex.

SUMMARY OF THE INVENTION

It is an object of the present invention to provide a phase-change memory device which suppresses the radiation of heat from metal layers above and below a memory cell to minimize a reduction in the thermal efficiency thereof, and which can be mass-produced in a large scale, and a method of manufacturing such a phase-change memory device.

According to an aspect of the present invention, there is provided a phase-change memory device comprising a different-material contact plug having a first electrically conductive material plug made of a first electrically conductive material, and a second electrically conductive material plug made of a second electrically conductive material having a specific resistance smaller than that of the first electrically conductive material, the first electrically conductive material plug and the second electrically conductive material plug being embedded in a common contact hole, a heater electrode having an end connected to the first electrically conductive material plug, a phase-change layer having a bottom surface including a portion connected to another end of the heater electrode, an extension electrode layer held in contact with a portion of the bottom surface of the phase-change layer in an area displaced off a position directly above a contact surface through which the phase-change layer and the heater electrode contact each other, and a contact electrode connected to a portion of an upper surface of the extension electrode layer.

The present invention thus provides a new basic structure of a phase-change memory device, i.e., a basic structure having a different-material contact plug and an extension electrode layer for achieving a high thermal efficiency, instead of the conventional basic structure which has a phase-change layer sandwiched between upper and lower electrodes. According to the present invention, the radiation of heat from the contact plug beneath the phase-change layer is reduced by the different-material contact plug. Specifically, since the heater electrode is connected to the first electrically conductive material plug of the first electrically conductive material whose specific resistance is greater and whose thermal conductivity is smaller than the second electrically conductive material, the radiation of heat is reduced. On the other hand, the radiation from the upper electrode of the phase-change layer is reduced by adopting an electrode structure wherein an extension electrode is used and an extension electrode is not provided on directly above the phase-change layer. Thus, since an electrode functioning as a heat sink is not present directly above a phase-change area, the radiation of heat is sufficiently reduced. Accordingly, the radiation of heat from both metal layers above and below the phase-change layer is effectively reduced, thus improving thermal efficiency upon a phase change, or in particular when the phase-change layer is reset. The radiation of heat from both the metal layers above and below the phase-change layer in a memory cell of the phase-change memory device is thus reduced, minimizing a reduction in thermal efficiency and making it possible to mass-produce large-scale phase-change memory devices.

Certain terminology used with respect to reducing the radiation of heat from the metal layer beneath the phase-change layer will be explained below. A contact plug is an electrode used to electrically connect an electronic circuit component to another electronic circuit component, and is generally embedded in an electrically insulating film. A different-material contact plug refers to a composite contact plug made of at least two electrically conductive material layers (electrically conductive plugs) held in contact with each other through surfaces thereof.

One conventional contact plug is of a structure which is formed by depositing a thin metal barrier, e.g., an auxiliary titanium layer to provide a good electrical connection with a lower silicon substrate, and thereafter embedding a metal having a small specific resistance, e.g., tungsten, in an insulating film. The conventional contact plug of this structure does not correspond to the "different-material contact plug" according to the present invention. The reason is that the portion of the conventional contact plug which functions as an electrode for interconnecting the electronic circuit components, i.e., the portion providing a current path, is made up of only a metal having a small specific resistance, e.g., tungsten, and the metal barrier is provided only for the purpose of manufacturing semiconductor devices better. The "different-material contact plug" according to the present invention includes at least two portions which function as electrodes for interconnecting the electronic circuit component, i.e., portions functioning as contact plugs, the two contact plugs being made of different electrically conductive materials and integrally combined into a composite contact plug. The electrically conductive materials of the "different-material contact plug" according to the present invention may also function as the metal barrier referred to above. The "different-material contact plug" according to the present invention is used to electrically interconnect a heater electrode and an electrically conductive layer which includes a diffused layer disposed in a silicon substrate, a metal electrode and interconnect, and another contact plug. The portion of the "different-material contact plug" according to the present invention which contacts the heater electrode is in the form of the first electrically conductive material plug that is made of the first electrically conductive material which has a greater specific resistance (a smaller electrical conductivity and a smaller thermal conductivity) than the second electrically conductive material, thereby reducing radiation of heat from the first electrically conductive material plug. Therefore, thermal efficiency of the phase-change memory device at the time data is written therein, particularly when the phase-change memory device is reset, is improved. The second electrically conductive material of the second electrically conductive material plug has a smaller specific resistance (a greater electrical conductivity and a greater thermal conductivity) than the first electrically conductive material. The second electrically conductive material plug is effective in sufficiently reducing the overall electrical resistance of the different-material contact plug. The plugs are held in contact with each other through at least side surfaces thereof, and the heater electrode and the second electrically conductive material plug do not overlap each other. Since the second electrically conductive material plug is made of a material having high electrical conductivity, the electric resistance of the electronic circuit is sufficiently reduced. The portion which is held in contact with the heater electrode is made of a material having low thermal conductivity for reduced heat radiation. Therefore, other electrodes and interconnects may be made of a metal material having low specific resistance such as tungsten (W) or aluminum (Al) or copper (Cu) that is used in silicon-based LSI circuits. Accordingly, a greater choice of materials that can be used is available, making it possible to manufacture a large-scale phase-change memory device. The specific resistance ($\rho$) is also called electric resistivity or volume resistivity, and the reciprocal ($1/\rho$) thereof is referred to as electrical conductivity which is also referred to as specific electrical conductivity. According to the present invention, the terms "specific resistance" and "electrical conductivity" will be used.

According to one embodiment of the present invention, the first electrically conductive material plug and the second electrically conductive material plug are held in contact with each other through at least respective side surfaces thereof, and the heater electrode and the second electrically conductive material plug do not overlap each other.

The structure of the different-material contact plug wherein the first electrically conductive material plug and the second electrically conductive material plug are juxtaposed can be easily formed by appropriately designing the planar shape of the contact hole and employing the CVD embedding technology. Therefore, it is advantageous for mass-producing phase-change memories. Specifically, if the planar shape of the contact hole is either P-shaped, L-shaped, or T-shaped and has a wider main body and a narrower protrusion, then when the first and second electrically conductive materials are successively deposited to adjusted thicknesses, the narrower protrusion is fully filled with the first electrically conductive material, and the wider main body is filled with the second electrically conductive material. The different-material contact plug is thus easily produced without the need for any special fabrication technologies.

According to another embodiment of the present invention, the first electrically conductive material plug and the second electrically conductive material plug are stacked in the contact hole, and the heater electrode and the second electrically conductive material plug overlap each other.

The structure of the different-material contact plug wherein the first electrically conductive material plug and the second electrically conductive material plug are stacked one on the other can minimize the area occupied by the different-material contact plug. The portion which is held in contact with the heater electrode includes the first electrically conductive material plug that is made of a first material having a greater specific resistance (a smaller electrical conductivity and a smaller thermal conductivity). Therefore, it is effective to reduce the radiation of heat transferred through the heater electrode. The second electrically conductive material plug is made of the second electrically conductive material having a smaller specific resistance (a greater electrical conductivity and a greater thermal conductivity). The second electrically conductive material plug sufficiently reduces the overall electric resistance of the different-material contact plug.

According to another embodiment of the present invention, the first electrically conductive material comprises a metal, a nitride of a metal, or a silicide of a metal, the metal being any one of titanium (Ti), tantalum (Ta), molybdenum (Mo), niobium (Nb), zirconium (Zr), and tungsten (W).

These metal materials which can be used as a major constituent of the first electrically conductive material plug can also be used as materials of the heater electrode. Either one of the metal materials has a smaller electric conductivity and a smaller thermal conductivity than aluminum (Al) and copper (Cu) used in silicon LSI circuits. These metal materials include metal materials that can be used as materials of the second electrically conductive material plug.

According to another embodiment of the present invention, the first electrically conductive material comprises titanium nitride (TiN), tantalum nitride (TaN), a molybdenum nitride (MoN), niobium nitride, titanium silicon nitride, titanium aluminum nitride, titanium boron nitride, zirconium-silicon nitride, tungsten-silicon nitride, tungsten-boron nitride, zirconium-aluminum nitride, molybdenum-silicon nitride, molybdenum-aluminum nitride, tantalum-silicon nitride, tantalum-aluminum nitride, titanium oxynitride, titanium aluminum oxynitride, tungsten oxynitride, tantalum oxynitride, tantalum silicide (TaSi), tungsten silicide (WSi), or molybdenum silicide (MoSi).

These metal materials that can be used to make the first electrically conductive material plug can basically be used as materials of the heater electrode. These metal materials include metal materials that can be used as materials of the second electrically conductive material plug.

According to another embodiment of the present invention, the second electrically conductive material comprises a metal which is either tungsten (W), aluminum (Al), molybdenum (Mo), or copper (Cu), or a silicide of the metal.

These metal materials that can be used to make the second electrically conductive material plug can basically be used as materials of ground electrodes and ground interconnects. These metal materials include metal materials that can be used as materials of the first electrically conductive material plug.

According to another embodiment of the present invention, the specific resistance of the first electrically conductive material is at least 10 times the specific resistance of the second electrically conductive material.

Both the electric conductivities and the thermal conductivities of the first electrically conductive material and the second electrically conductive material should preferably, but not necessarily, be different from each other by about 10 times.

According to another embodiment of the present invention, the phase-change device further comprises a first insulating film in which the heater electrode being embedded, and a second insulating film disposed on the first insulating film and patterned to expose at least a portion of an upper surface of the heater electrode, wherein the extension electrode layer has a predetermined pattern and is disposed on the patterned insulating film, and the phase-change layer is disposed in covering relation to a portion of the extension electrode layer and the exposed portion of the upper surface of the heater electrode.

Both the heater electrode and the extension electrode layer are held in contact with the bottom surface of the phase-change layer. However, the extension electrode layer is held in contact with the bottom surface of the phase-change layer in overlapping relation to the bottom surface of the phase-change layer in the region displaced off the position directly above the contact surface through which the phase-change layer and the heater electrode contact each other. At a location displaced off a position above the heater electrode, a contact electrode is directly connected to the extension electrode layer. Since there is no electrode functioning as a heat sink directly above the phase-change area of the phase-change layer, Joule heat generated by an electric current is not radiated through an electrode as is conventional, and the thermal efficiency of a phase-change process is improved. Therefore, a reset current is reduced, and the memory size of the phase-change memory device is reduced. Since no conventional upper electrode is present, no upper electrode thickness problem is posed. In the phase-change memory device according to the present invention, since the extension electrode layer can be formed to a sufficient thickness without any problems, the resistance of interconnects is reduced. Because a phase-change layer of GST or the like is not present directly below the contact electrode, when the contact hole is formed, the problems of contamination due to an exposed phase-change layer, sublimation or elimination of a portion of such a phase-change layer, and a contact hole embedding failure are not caused. In the structure of the phase-change memory device according to the present invention, the phase-change layer has its bottom surface held in better contact with the extension electrode layer (metal layer) than with the conventional structure wherein the phase-change layer is held in contact with an insulating film. Even if a contact layer such as a thin film of titanium (Ti) or the like is provided on the extension electrode layer for increased adhesion, since the contact layer does not contact the phase-change layer in the phase-change area where a phase change occurs, components of the contact layer and the phase-change layer in the phase-change area will not be bonded to each other and will not cause a compositional change. Accordingly, the contact layer does not adversely affect the writing characteristics of the phase-change memory device. Since the extension electrode layer, i.e., a metal layer of tungsten (W) or the like, is independent of the phase-change layer in the fabrication process, interconnections and electrodes of a peripheral circuit can simultaneously be formed during the process of forming the extension electrode layer in a memory cell. The fabrication process can thus be shared by the phase-change memory device and the peripheral circuit. It is possible to freely change the position of the contact electrode by changing the pattern of the extension electrode layer, resulting in increased freedom with which to design the electrode structure.

According to another embodiment of the present invention, the extension electrode layer comprises a main electrode layer and a contact layer formed on a surface of the main electrode layer for better contact between the extension electrode layer and the phase-change layer.

Because the contact layer made of titanium (Ti) or the like is disposed on the main electrode layer made of tungsten (W) or the like in the extension electrode layer, the phase-change layer and the extension electrode layer are held in better contact with each other. Inasmuch as the contact layer is not held in contact with the phase-change layer in the area where a phase change occurs, components of the extension electrode layer and the phase-change layer in the phase-change area will not be bonded to each other and will not cause a compositional change. Accordingly, the extension electrode layer does not adversely affect the writing characteristics of the phase-change memory device.

According to another aspect of the present invention, there is also provided a method of manufacturing a phase-change memory device, comprising the steps of:

(a) forming a contact hole in a first insulating film and embedding, in the contact hole, a first electrically conductive material plug made of a first electrically conductive material, and a second electrically conductive material plug made of a second electrically conductive material having a specific resistance smaller than the first electrically conductive material, thereby to produce a different-material contact plug;

(b) forming a second insulating film on the first insulating film, forming a contact hole in the second insulating film, and forming a heater electrode in the contact hole in the second insulating film, the heater electrode having an end connected to the first electrically conductive material plug;

(c) forming an extension electrode layer and exposing at least a portion of a heater electrode;

(d) forming a phase-change layer in covering relation to the extension electrode layer and the exposed portion of the heater electrode;

(e) patterning the phase-change layer to keep a portion of the phase-change layer and a portion of the extension electrode layer in overlapping relation to each other near the heater electrode, and to expose the extension electrode layer at a location displaced off the overlapping portions of the phase-change layer and the extension electrode layer; and (f) forming a contact hole in an insulating film on the phase-change layer and the extension electrode layer, the contact hole extending to the extension electrode layer, and forming a contact plug held in direct contact with the extension electrode layer through the contact hole.

According to the above method, the different-material contact plug, the phase-change layer, the extension electrode layer, and the contact plug which is held in direct contact with the extension electrode layer are formed using the basic fabrication process technology for silicon ICs, without the need for any special fabrication process. Consequently, new phase-change memory devices having a different-material contact plug and an extension electrode layer can easily be mass-produced without undue limitations.

According to an embodiment of the present invention, step (a) comprises the steps of:

selectively patterning a portion of the first insulating film to form the contact hole therein, the contact hole having a planar shape including a wider main body and a narrower protrusion projecting from the main body and having a width smaller than a width of the main body;

embedding the first electrically conductive material in the contact hole such that the protrusion is fully embedded, thereby forming the first electrically conductive material plug; and embedding the second electrically conductive material in a portion of the contact hole which corresponds to the main body, thereby forming the second electrically conductive material plug.

A narrow groove can be fully filled with a thin film having a given thickness, and a wider groove cannot be fully filled. Based on an understanding of such a phenomenon, the planar shape of the contact hole is designed to have a main body and a protrusion. The narrower groove, i.e., the protrusion, is fully filled with the first electrically conductive material, producing the first electrically conductive material plug. Then, the wider groove, i.e., the main body, which stays concave, is filled with the second electrically conductive material, producing the second electrically conductive material plug. By adjusting the planar pattern of the grooves, i.e., the contact hole and the widths of the grooves, and the film thicknesses of the first and second electrically conductive materials, the different-material contact plug can be easily formed simply according to contact hole embedding technology such as CVD or the like. The manufacturing method is effective for large scale manufacturing of phase-change memory devices which meet contradictory requirements for reduced heat radiation and reduced electric resistance, using general-purpose fabrication technology, i.e., without the need for any special fabrication steps.

According to an embodiment of the present invention, step (a) comprises the steps of:

selectively patterning a portion of the first insulating film to form the contact hole therein;

embedding the second electrically conductive material in the contact hole and etching back the second electrically conductive material until the second electrically conductive material has an upper surface lower than an upper surface of the contact hole, thereby forming second electrically conductive material plug; and embedding the first electrically conductive material in the contact hole above the second electrically conductive material plug, thereby forming second electrically conductive material plug.

After the second electrically conductive material is embedded in a lower space in the contact hole using metal material embedding technology and etching technology, the first electrically conductive material is embedded in an upper space in the contact hole, thereby forming the different-material contact plug. The manufacturing method is effective for large scale manufacturing of phase-change memory devices which meet contradictory requirements for reduced heat radiation and reduced electric resistance, using general-purpose fabrication technology, i.e., without the need for special fabrication steps.

According to another embodiment of the present invention, step (c) comprises the step of:

successively patterning the extension electrode layer and an insulating film therebeneath to expose at least a portion of an upper surface of the heater electrode;

wherein when the extension electrode layer and the insulating film therebeneath are successively patterned, the patterned extension electrode layer has a substantially vertical cross-sectional shape and the patterned insulating film has a slanted cross-sectional shape due to different etching rates of the extension electrode layer and the insulating film therebeneath, so that one end of the extension electrode layer is automatically positioned at a location displaced off a position directly above a contact area through which the phase-change layer and the heater electrode contact each other.

In the phase-change memory according to the present invention, the relative positional relationship between the heater electrode and the end of the extension electrode layer is very important. Specifically, the extension electrode layer should not obstruct good contact between the heater electrode and the phase-change layer. However, if the end of the extension electrode layer is excessively spaced away from the contact surface between the heater electrode and the phase-change layer, then the requirement for a reduced memory size cannot be met. The manufacturing method according to the present invention employs a self-aligning positioning technique for automatically determining the relative positions of the heater electrode and the end of the extension electrode. According to the self-alignment positioning technique, when the insulating film on the heater electrode is patterned, the extension electrode layer is processed and the insulating film therebeneath is removed using a common mask, thereby forming an opening. Since the etching rate for the extension electrode layer is higher, the processed portion of the extension electrode layer has a substantially vertical cross-sectional shape, and since the etching rate for the insulating film is lower (i.e., the insulating film is regrown simultaneously while it is being etched) the processed portion of the insulating film has a tapered (slanted) cross-sectional shape. Therefore, the contact surface between the heater electrode and the phase-change layer is formed so as to be spaced from the end of the extension electrode layer by a distance corresponding to the horizontal projection of the slanted surface of the insulating film. Consequently, the relative positional relationship between the end of the extension electrode layer and the contact surface between the heater electrode and the phase-change layer is automatically determined. As a result, the fabrication of a minute phase-change memory device is facilitated without a positioning problem.

According to another embodiment of the present invention, step (c) comprises the steps of:

forming a main electrode layer; and forming a contact layer disposed on a surface of the main electrode layer for better contact between the extension electrode layer and the phase-change layer, thereby forming the extension electrode layer.

Because the contact layer made of titanium (Ti) or the like is disposed on the main electrode layer made of tungsten (W) or the like in the extension electrode layer, the phase-change layer and the extension electrode layer are held in better contact with each other. Inasmuch as the contact layer is not held in contact with the phase-change layer in the area where a phase change occurs, components of the extension electrode layer and the phase-change layer in the phase-change area will not be bonded to each other and will not cause a compositional change. Accordingly, the extension electrode layer does not adversely affect the writing characteristics of the phase-change memory device.

The above and other objects, features and advantages of the present invention will become apparent from the following description with reference to the accompanying drawings which illustrate examples of the present invention.

BRIEF DESCRIPTION OF THE DRAWINGS

FIGS. 4A through 4D are views showing planar configurations of different-material contact plugs;

DESCRIPTION OF THE PREFERRED EMBODIMENTS

1st Embodiment

Figure 1:
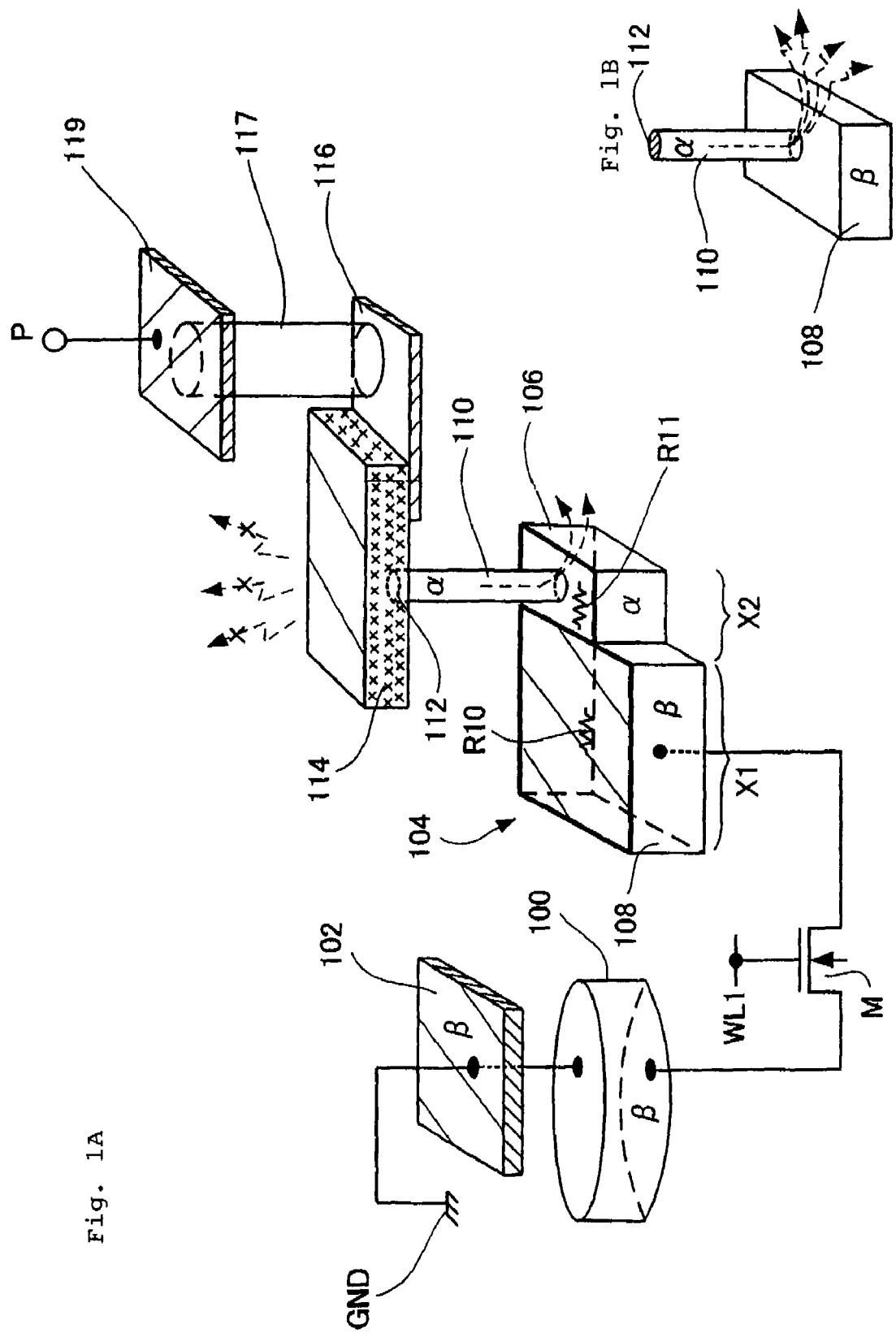
FIG. 1A is a view showing an essential structure of a phase-change memory device according to the present invention.
FIG. 1B is a view showing a conventional structure by which a heater electrode and a contact plug are connected to each other, as a comparative example.

FIGS. 1A and 1B show a characteristic structure of a phase-change memory device according to the present invention. FIG. 1A shows an essential structure of the phase-change memory device according to the present invention, and FIG. 1B shows a conventional structure by which a heater electrode and a contact plug are connected to each other, as a comparative example.

As shown in FIG. 1A, an NMOS transistor (N-channel insulated-gate field effect transistor) M is a switching element for selecting a memory cell, and has a gate connected to word line WL1. The source of NMOS transistor M is connected to ground potential metal plug 100 made of material β and also to ground potential (reference potential) GND through ground potential interconnect 102 which is a ground interconnect made of material β. The drain of NMOS transistor M is electrically connected to second electrically conductive material plug 108 of different-material contact plug 104.

Different-material contact plug 104 comprises first electrically conductive material plug 106 made of first electrically conductive material α and second electrically conductive material plug 108 made of second electrically conductive material β. Plugs 106, 108 are held in contact with each other through at least respective side surfaces thereof, resulting in electrical conduction between plugs 106, 108. First electrically conductive material plug 106 has specific resistance R11, and second electrically conductive material plug 108 has specific resistance R10. Specific resistances R11, R10 are related to each other such that R11>R10.

The specific resistance (ρ) is also called electric resistivity or volume resistivity, and the reciprocal (1/ρ) thereof is referred to as electrical conductivity which is also referred to as specific electrical conductivity. According to the present invention, the terms "specific resistance" and "electrical conductivity" will be used. A metal material which allows an electric current to flow easily therethrough also allows heat to be transferred easily therethrough. Therefore, a material having a larger specific resistance has a larger electrical conductivity and a larger thermal conductivity. First electrically conductive material α and second electrically conductive material α are related to each other such that α<β with respect to their electrical conductivity and thermal conductivity.

Heater electrode 110, which is a lower electrode made of material α has a bottom surface held in contact with the upper surface of first electrically conductive material plug 106. Heater electrode 110 has an upper surface held in contact with the bottom surface of phase-change layer 114 (also called GST). An area near contact surface 112 across which heater electrode 110 and phase-change layer 114 contact each other serves as a phase-change area where a phase change occurs.

Figure 22A:
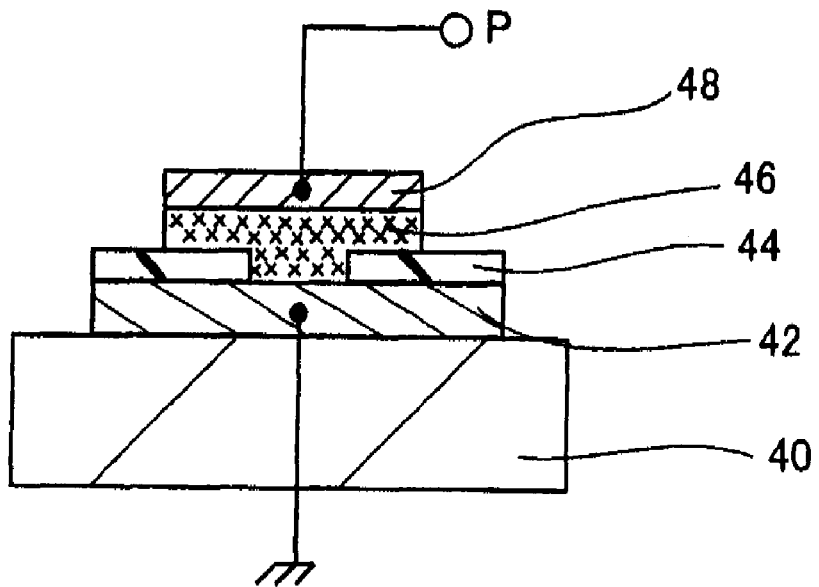
FIGS. 22A and 22B are diagrams illustrating a basic structure of a phase-change memory device and the manner in which the phase-change memory device is set and reset.
Figure 22B:
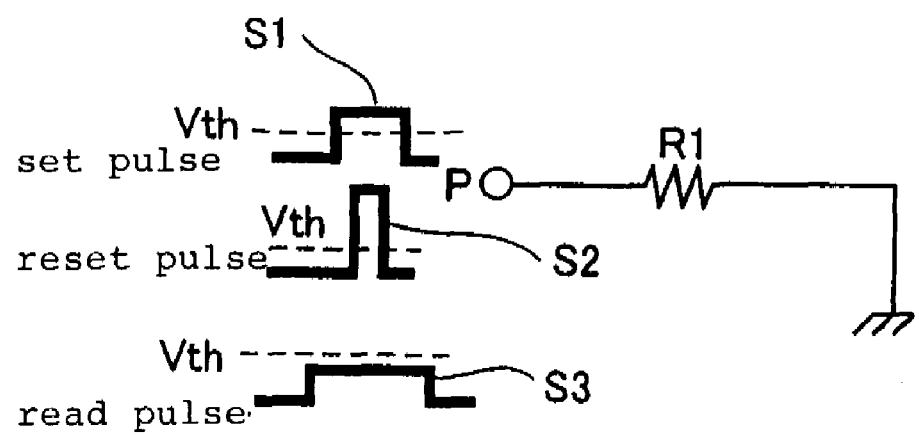

In the conventional structure, an upper electrode is disposed on the upper surface of phase-change layer 114. In FIG. 1A, no upper electrode is provided. Instead, there is provided extension electrode layer 116 that is connected to a portion of the bottom surface of phase-change layer 114. Contact plug 117 is connected directly to extension electrode layer 116 at a location displaced off the area (i.e., the phase-change area) directly above contact surface 112 across which heater electrode 110 and phase-change layer 114 contact each other. Electrode 119 is disposed on contact plug 117 and serves as terminal P (see FIGS. 22A, 25) to which various pulses are applied.

The phase-change memory device of the above structure according to the present embodiment allows improvement of a thermal conductivity upon a phase change (in particular, when the phase-change memory device is reset) to be compatible with a realization of a low-resistance circuit. Specifically, radiation of heat from the metal layers above and below the phase-change area in the memory cell of the phase-change memory device is reduced, any reduction in the thermal efficiency is minimized, and large-scale phase-change memories can be mass-produced.

As can be seen in FIG. 1A, the bottom surface of heater electrode 110 is held in contact with first electrically conductive material plug 106 which is made of a first electrically conductive material having a large specific resistance and a low thermal conductivity. Therefore, radiation of heat from the metal layer (i.e., first electrically conductive material plug 106) positioned below heater electrode 110 is suppressed. If the bottom surface of heater electrode 110 is held in contact with second electrically conductive material plug 108 which is made of a second electrically conductive material that is a good electrical conductor, as shown in FIG. 1B, second electrically conductive material plug 108 functions as a heat sink having good heat radiating capability which increases the amount of radiated heat and hence results in an increased loss of Joule heat that is to be used for causing a phase change. Use of different-material contact plug 104 is effective to reduce the radiation of heat through the metal layer below heat electrode 110.

Figure 25:
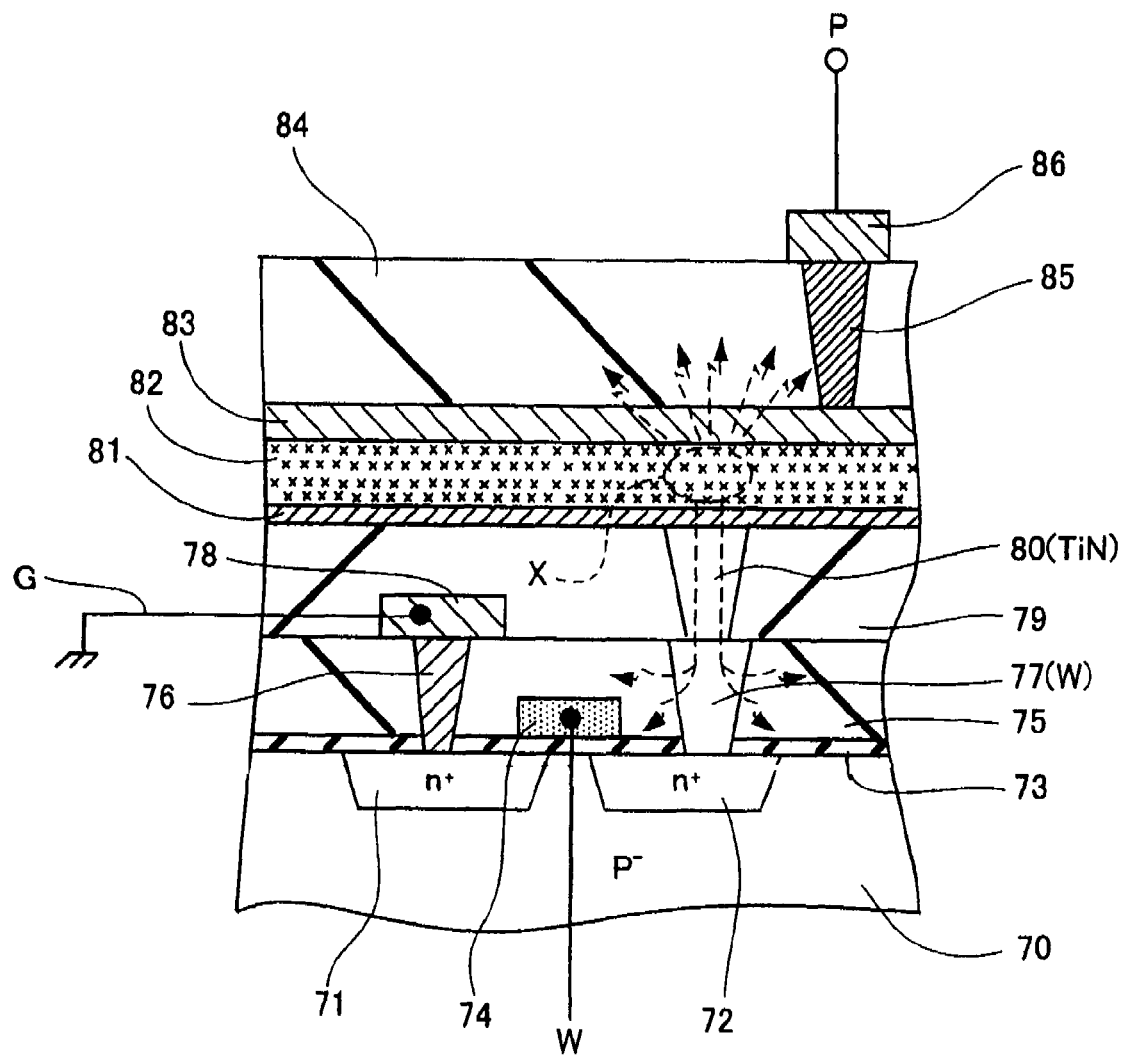
FIG. 25 is a fragmentary cross-sectional view showing specific structural details of a memory cell of a phase-change memory device (phase-change memory IC) and illustrating problems thereof.

In the conventional structure shown in FIG. 25, the electrode above phase-change layer (GST layer) 82 functions as a heat sink for discharging Joule heat from the phase-change area. In the electrode structure shown in FIG. 1A, however, no electrode is disposed above phase-change layer (GST layer) 114 and hence no metal layer functions as a heat sink thereabove. Consequently, heat is prevented from being discharged through a metal layer directly from above the phase-change area of heater electrode 110. In FIG. 1A, "x"s in dotted-line arrows (indicative of heat radiation) that are directed upwardly from phase-change layer 114, indicate that there is no heat radiation from the upper surface of phase-change layer 114.

Extension electrode layer 116 is thus used to provide an electrode structure wherein no electrode is disposed above phase-change layer 114, for thereby effectively reducing the radiation of heat through a metal layer above heater electrode 110.

Based on the basic structure of the phase-change memory device according to the present embodiment shown in FIG. 1A, the radiation of heat from both the metal layer above the heater electrode and the metal layer below the heater electrode is effectively reduced to minimize any loss of Joule heat. Therefore large scale manufacturing of phase-change memory devices is possible.

The electrode structure employing extension electrode layer 116 provides many more advantages. The bottom surface of phase-change layer 114 is held in contact with extension electrode layer 116 for better adhesion than if phase-change layer 114 is held in contact with a lower insulating film. Even if a contact layer, not shown in FIG. 1A, such as a thin film of titanium (Ti) or the like is provided on extension electrode layer 116 for increased adhesion, since the contact layer does not contact the phase-change area, components of the contact layer and the phase-change area will not be bonded to each other and will not cause a compositional change. Accordingly, the contact layer does not adversely affect the writing characteristics of the phase-change memory device. According to the present invention, therefore, the writing characteristics of the phase-change memory device are not adversely affected at all, and the problem of phase-change layer peel is reliably solved.

The structure employing extension electrode layer 116 shown in FIG. 1A makes it possible to freely change the position of the contact plug by changing the pattern of extension electrode layer 116, resulting in increased freedom with which to design the electrode structure.

Since extension electrode layer 116 is independent of phase-change layer 114, interconnections and electrodes of a peripheral circuit can simultaneously be formed in the process of forming extension electrode 116. This is advantageous in manufacturing large LSI circuits.

If an electrode is disposed above the phase-change layer, then it is necessary to provide an interlayer insulating film on the electrode, form a contact hole in the interlayer insulating film, and embed a contact plug in the contact hole to provide electrode terminal P. In the conventional structure shown in FIG. 25, when the contact hole is formed, if the upper electrode layer (indicated by 83 in FIG. 25) functioning as an etching stopper is penetrated by chance, then the phase-change layer (indicated by 82 in FIG. 25) will be exposed, causing line contamination, or a gas produced from the phase-change layer will fill the contact hole, preventing the contact plug from being embedded in the contact hole. The possibility of such an accident is extremely low, there is still some possibility. The structure employing extension electrode layer 116 shown in FIG. 1A eliminates all such problems in the fabrication process.

Extension electrode layer 116 can be easily formed by the basic silicon LSI fabrication technology without the need for any special manufacturing steps. Therefore, the phase-change memory device shown in FIG. 1A can reasonably be mass-produced.

As described above, the phase-change memory device shown in FIG. 1A is highly advantageous in that different-material contact plug 104 improves the thermal efficiency, the electrode structure employing the extension electrode layer improves the thermal efficiency, it is easy to form a contact layer, there are no fabrication process problems, the phase-change memory device can share a fabrication process with a peripheral circuit, and the freedom with which to design the electrode structure is high. The phase-change memory device is thus highly advantageous to stably mass-produce large-scale phase-change memory ICs.

2nd Embodiment

In the second embodiment, different-material contact plug 104 shown in FIG. 1A will be considered with respect to various details below.

Preferred aspects of different-material contact plug 104 and their features are listed as follows:

(1) Different-material contact plug 104 is made up of first electrically conductive material plug 106 and second electrically conductive material plug 108. First electrically conductive material a of first electrically conductive material plug 106 and second electrically conductive material $\beta$ of second electrically conductive material plug 108 are related to each other such that $\alpha>\beta$ with respect to the specific resistance and $\alpha<\beta$ with respect to the electrical conductivity and the thermal conductivity, as described above.

For example, if titanium (Ti: electrical conductivity of $1.34\times10^4$ S/cm and thermal conductivity of 21.9 W/m·K) is used as first electrically conductive material $\alpha$, then tungsten (W: electrical conductivity of $10.0\times10^4$ S/cm and thermal conductivity of 17.4 W/m·K) whose electrical conductivity and thermal conductivity are greater than titanium is used as second electrically conductive material $\beta$.

In (2) and (3) below, specific materials that can be used as the first and second electrically conductive materials will be enumerated. Some metal materials, e.g., tungsten and molybdenum, are listed in both (2) and (3). Stated otherwise, tungsten and molybdenum may be used as both the first and second electrically conductive materials. The idea of the present invention does not reside in materials themselves, but combinations thereof. It is important according to the present invention that the relationship $\alpha>\beta$ be satisfied with respect to the specific resistance and the relationship $\alpha<\beta$ be satisfied with respect to the electrical conductivity and the thermal conductivity.

(2) First electrically conductive material plug 106 is made of first electrically conductive material $\alpha$, e.g., titanium nitride (TiN), that is selected from the standpoint of attaching more importance to thermal conductivity than to electrical conductivity and reducing thermal conductivity. First electrically conductive material a should preferably be the same material as heater electrode 110 or a material similar to heater electrode 110, i.e., a material whose major constituent is the same as that of heater electrode 110.

Specifically, first electrically conductive material $\alpha$ may be a material selected from the group consisting of titanium (Ti), tantalum (Ta), molybdenum (Mo), niobium (Nb), zirconium (Zr), and tungsten (W), or a nitride of an either one of the metals, or a silicide of an either one of the metals. More specifically, first electrically conductive material a may be a material including titanium nitride (TiN), tantalum nitride (TaN), a molybdenum nitride (MoN), niobium nitride, titanium silicon nitride, titanium aluminum nitride, titanium boron nitride, zirconium-silicon nitride, tungsten-silicon nitride, tungsten-boron nitride, zirconium-aluminum nitride, molybdenum-silicon nitride, molybdenum-aluminum nitride, tantalum-silicon nitride, tantalum-aluminum nitride, titanium oxynitride, titanium aluminum oxynitride, tungsten oxynitride, tantalum oxynitride, tantalum silicide (TaSi), tungsten silicide (WSi), or molybdenum silicide (MoSi).

(3) Second electrically conductive material plug 108 is made of second electrically conductive material $\beta$, e.g., tungsten (W), that is selected from the standpoint of attaching more importance to electrical conductivity than to thermal conductivity and reducing the circuit resistance. Second electrically conductive material $\beta$ should preferably be the same material as ground potential plug 100 and ground potential interconnect 102 which needs to be low in resistance, or should preferably be a material similar to ground potential plug 100 and ground potential interconnect 102, i.e., a material whose major constituent is the same as that of ground potential plug 100 and ground potential interconnect 102. Specifically, second electrically conductive material $\beta$ may be either one of metals that include tungsten (W), aluminum (Al), molybdenum (Mo), and copper (Cu), or a silicide of either one of these metals.

(4) The electrical conductivity and the thermal conductivity of the major metal materials of first and second electrically conductive materials $\alpha$, $\beta$ should preferably, but not necessarily, be of approximate numerical values as follows:

The major metal material (first electrically conductive material $\alpha$) of first electrically conductive material plug 106 should preferably have an electrical conductivity of the order of $1.0\times10^4$ S/cm and a thermal conductivity of the order of 10.0 W/m·K, and the major metal material (second electrically conductive material $\beta$) of second electrically conductive material plug 108 should preferably have an electrical conductivity of the order of $10.0\times10^4$ S/cm and a thermal conductivity of the order of 100.0 W/m·K. It is desirable that the electrical conductivity and the thermal conductivity of first electrically conductive material a be different from the electrical conductivity and the thermal conductivity of second electrically conductive material $\beta$ by about 10 times, preferably more than 10 times.

The electrical conductivities and the thermal conductivities of metal materials which can be candidates for the major constituents of first and second electrically conductive materials $\alpha$, $\beta$ are as follows: The electrical conductivity is indicated by C, and the thermal conductivity by P.

Candidates for the major constituent of first electrically conductive material $\alpha$ are:

Ti (titanium): C=$2.34\times10^4$ S/cm, P=21.9 W/m·K

Nb (niobium): C=$6.93\times10^4$ S/cm, P=53.7 W/m·K

Ta (tantalum): C=$7.61\times10^4$ S/cm P=57.5 W/m·K

Zr (zirconium): C=$2.36\times10^4$ S/cm, P=22.7 W/m·K

Candidates for the major constituent of second electrically conductive material $\beta$ are:

Al (aluminum): C=$37.7\times10^4$ S/cm, P=237 W/m·K

Mo (molybdenum): C=$18.7\times10^4$ S/cm, P=138 W/m·K

Cu (copper): C=$59.6\times10^4$ S/cm, P=401 W/m·K

W (tungsten): C=$18.9\times10^4$ S/cm, P=174 W/m·K

It can be seen from the numerical values of the electrical conductivities (and thin-film specific resistances) and from the numerical values of the thermal conductivities of the metal materials that the metal material which can be the major constituent of first electrically conductive material a has an electrical conductivity of the order of $1.0\times10^4$ S/cm and a thermal conductivity of the order of 10.0 W/m·K, the metal material which can be the major constituent of second electrically conductive material $\beta$ has an electrical conductivity of the order of $10.0\times10^4$ S/cm and a thermal conductivity of the order of 100.0 W/m·K, and the electrical conductivity and the thermal conductivity of first electrically conductive material α are different from the electrical conductivity and the thermal conductivity of second electrically conductive material β by about 10 times.

(5) Examples of preferred electrically conductive materials are titanium nitride (TiN) and tungsten (W). That is, a thin film of titanium nitride (TiN) may be used as first electrically conductive material α and a thin film of tungsten (W) may be used as second electrically conductive material β. The specific resistances of a thin film of titanium nitride (TiN) and a thin film of tungsten (W) will be compared with each other below. If a thin film of metal nitride is formed by CVD, then the specific resistance of the thin film varies depending on the raw material gas, and the range in which the specific resistance of the thin film varies also differs depending on the raw material gas. According to an experiment conducted by the inventor of the present invention, if TiC14 was used as the raw material gas, then the specific resistance of the thin film of TiN could vary in the range from 220 $\mu\Omega\cdot cm$ to 900 $\mu\Omega\cdot cm$. According to the MOCVD process, i.e., if Ti[N($C_2H_5$)$_2$]$_4$ was used as the raw material gas, then the specific resistance of the thin film of TiN could vary in the range from 200 $\mu\Omega\cdot cm$ to 6000 $\mu\Omega\cdot cm$. In either case, the specific resistance of the thin film of TiN is considerably large.

The inventor of the present invention produced a thin film of tungsten (W) according to the CVD process, and measured the specific resistance of the thin film. The measured specific resistance of the thin film was 10 $\mu\Omega\cdot cm$. This shows that the specific resistance of the thin film of tungsten is less than 1/10 of the specific resistance of the thin film of TiN.

(6) The volume of second electrically conductive material plug 108 should preferably be greater than the volume of first electrically conductive material plug 106. First electrically conductive material plug 106 is provided primarily for reducing the radiation of heat transferred from heater electrode 110. The electrical resistance of first electrically conductive material plug 106 tends to increase slightly. However, if the volume of second electrically conductive material plug 108 which is made of a good conductor is greater than the volume of first electrically conductive material plug 106, then the electrical resistance of different-material contact plug 104 is governed by second electrically conductive material plug 108. Therefore, the overall electrical resistance of different-material contact plug 104 can be sufficiently low, causing no circuit operation problems.

(7) First electrically conductive material plug 106 and second electrically conductive material plug 108 are held in contact with each other through at least respective side surfaces thereof. Heater electrode 110 and second electrically conductive material plug 108 do not overlap each other. Stated otherwise, second electrically conductive material plug 108 is not present directly below heater electrode 110. The phrase "first and second electrically conductive material plugs 106, 108 contact each other through at least respective side surfaces thereof" means that first and second electrically conductive material plugs 106, 108 may contact each other through any surfaces thereof, but such surfaces should necessarily include side surfaces thereof.

(8) Different-material contact plug 104 as it is seen in plan comprises main body X1 which is mainly composed of second electrically conductive material plug 108 and protrusion X2 which is mainly composed of first electrically conductive material plug 106, protrusion X2 projecting from main body X1. The planar shape, including main body X1 and protrusion X2, of different-material contact plug 104 is selected in consideration of the process of manufacturing different-material contact plug 104. Specifically, a contact hole formed in an interlayer insulating film has a planar shape including a wider main body and a narrower protrusion. When a thin film made of first electrically conductive material is formed on the interlayer insulating film by the CVD process, the narrower protrusion is fully filled with the first electrically conductive material to produce protrusion X2, and the wider main body is not fully filled with the first electrically conductive material, leaving a large cavity. The large cavity is then fully filled with a thin film made of second electrically conductive material to produce main body X1. In this manner, different-material contact plug 104 is manufactured with ease. The manufacture of different-material contact plug 104 will be described later with reference to FIGS. 2 through 4D.

3rd Embodiment

In the present embodiment, the planar shape of a different-material contact plug, examples of materials used, and a method of manufacturing a different-material contact plug (and a ground potential plug) will be described below with reference to FIGS. 2 through 4D.

Figure 2:
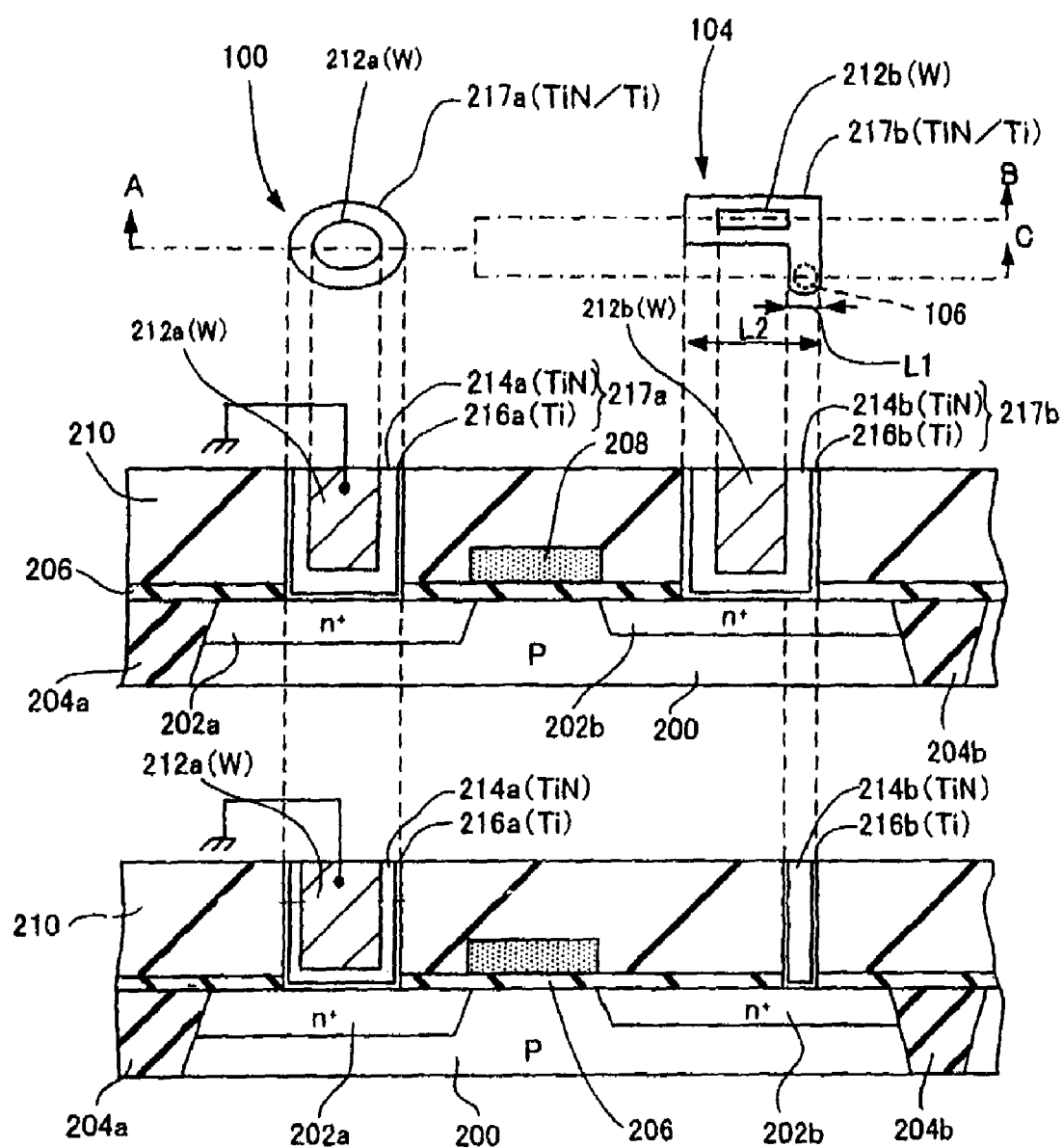
FIG. 2 is a view showing planar configurations of a different-material contact plug and a ground potential plug and an essential cross-sectional structure of a phase-change memory device with those plugs.

FIG. 2 shows planar configurations of a different-material contact plug and a ground potential plug and an essential cross-sectional structure of a phase-change memory device with those plugs. In FIG. 2, an upper section shows planar configurations of a different-material contact plug and a ground potential plug, a middle section shows a cross section of the device taken along line A-B of the upper section, and a lower section shows a cross section of the device taken along line A-C of the upper section.

Ground potential plug 100 and different-material contact plug 104 comprise respective TiN/Ti films 217a, 217b each having a lower thin titanium film and a titanium nitride film disposed thereon, made of a first electrically conductive material, i.e., a material selected for thermal conductivity, and respective W (tungsten) films 212a, 212b made of a second electrically conductive material, i.e., a material selected for electrical conductivity.

In the upper section of FIG. 2, TiN/Ti films 217a, 217b are regarded as single films. In the middle and lower sections of FIG. 2, TiN/Ti films 217a, 217b are shown as including respective titanium (Ti) films 216a, 216b and respective titanium nitride (TiN) films 214a, 214b. Thin titanium (Ti) films 216a, 216b serve as films for keeping TiN/Ti films 217a, 217b in good electrical contact with lower silicon substrate 200 because they cause a silicide reaction with silicon substrate 200 to provide a good ohmic contact. Therefore, titanium (Ti) films 216a, 216b are not essential films of TiN/Ti films 217a, 217b. Rather, titanium nitride (TiN) films 214a, 214b provide an essential function as the first electrically conductive material.

As can be seen from the upper section of FIG. 2, ground potential plug 100 is of a circular (elliptical) shape. Ground potential plug 100 is formed by filling a peripheral portion of a contact hole in interlayer insulating film 210 with TiN/Ti film 217a including lower thin titanium film 216a and titanium nitride film 214a thereon, and filling a central portion of the contact hole with W (tungsten) film 212a.

As shown in FIG. 1A, different-material contact plug 104 is of an L shape provided by a combination of the main body and the protrusion. Specific examples of the planar configuration of different-material contact plug 104 will be described later with reference to FIGS. 4A through 4D.

Different-material contact plug 104 is formed by filling a narrower portion of a contact hole in interlayer insulating film 210 with TiN/Ti film 217b including lower thin titanium film 216b and titanium nitride film 214b thereon, and filling a wider central portion of the contact hole with W (tungsten)

film 212b. The protrusion, which is part of the filled narrower portion of the contact hole, has width L1, and the main body, which includes the filled wider central portion of the contact hole, has width L2. Heater electrode 218 made of titanium nitride (TiN) is connected to the protrusion near its distal end.

As can be seen from the middle section of FIG. 2, p-type semiconductor substrate 200 includes a field region surrounded by STIs (Shallow Trench Isolations) 204a, 204b and having an NMOS transistor formed therein. The NMOS transistor comprises n-type diffused layers (a source layer and a drain layer) 202a, 202b, gate insulating film 206, and gate electrode (doped polysilicon layer) 208. Interlayer insulating film 210 has contact holes defined therein which are filled successively with Ti, TiN, and W to provide ground potential plug 100 and different-material contact plug 104.

Figure 8:
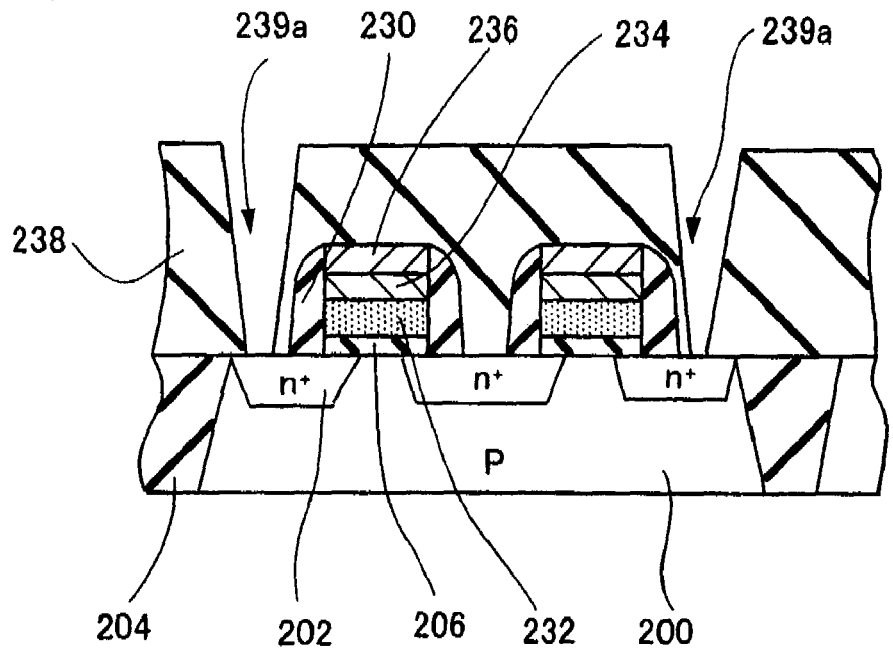
FIG. 8 is a cross-sectional view of a second manufacturing step which is illustrative of the method of manufacturing a cross-sectional structure of the device taken along line A-A of FIG. 6.
Figure 9:
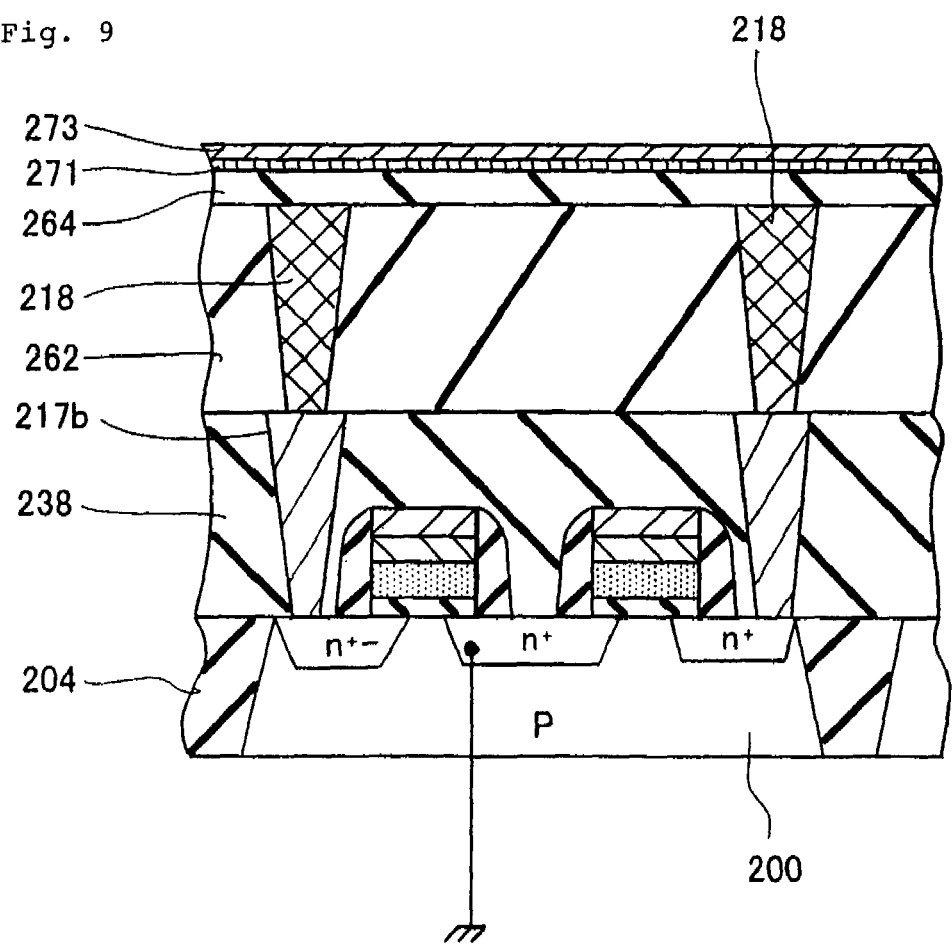
FIG. 9 is a cross-sectional view of a third manufacturing step which is illustrative of the method of manufacturing a cross-sectional structure of the device taken along line A-A of FIG. 6.

As can be seen from the lower section of FIG. 8, the protrusion of different-material contact plug 104 comprises titanium (Ti) film 216b and titanium nitride (TiN) film 214b which fully fill the corresponding contact hole in interlayer insulating film 210. Heater electrode 218 made of TiN is held in contact with the protrusion.

A method of manufacturing an essential structure of the phase-change memory device shown in FIG. 2 will be explained below.

FIGS. 3A through 3D are cross-sectional views of a device in major processing steps, illustrating a method of manufacturing an essential structure of the phase-change memory device shown in FIG. 2.

Figure 3A:
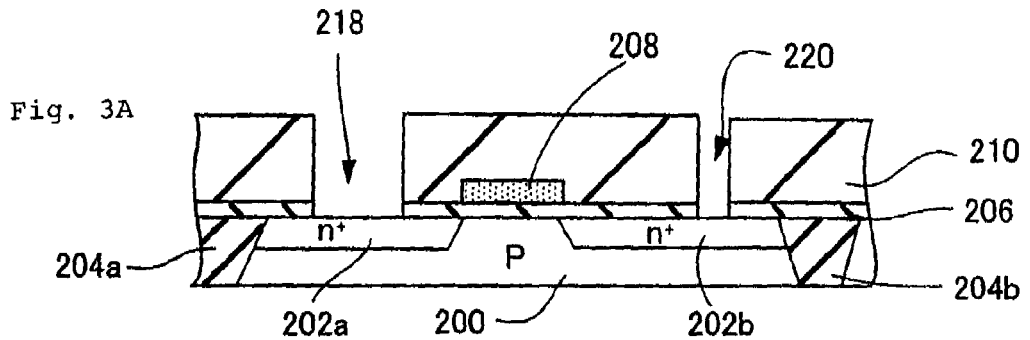
FIG. 3A through 3D are cross-sectional views of a device in major processing steps, illustrating a method of manufacturing an essential structure of the phase-change memory device shown in FIG. 2.

As shown in FIG. 3A, STIs (Shallow Trench Isolations) 204a, 204b are formed in p-type semiconductor substrate 200. A device forming region (field region) is surrounded by STIs 204a, 204b. Then, gate insulating film 206 is deposited to a thickness of 7 nm, for example, on the surface of semiconductor substrate 200. Then, a film of doped silicon and a film of tungsten silicide are successively deposited to respective thicknesses of 100 nm, after which a photolithographic mask is formed. Then, the film of doped silicon and the film of tungsten silicide are etched by anisotropic etching, forming gate electrode 208. Then, using gate electrode 208 as a mask, ions of phosphorus (P) are introduced into semiconductor substrate 200. The assembly is then heated to form n-type diffused layers (source and drain layers) 202a, 202b. Then, interlayer insulating film 210 in the form of a TEOS oxide film is deposited to a thickness of 700 nm, after which the assembly is planarized by CMP (Chemical Mechanical Polishing).

Interlayer insulating film 210 is patterned to form contact hole (opening) 218 having a circular planar shape and a width of 200 nm, for example, for forming ground potential plug 100, and contact hole 220 having an L-shaped planar shape (see FIG. 2, the upper section on the right) for forming different-material contact plug 104. In FIG. 3A, the reference numeral 220 denotes a narrow groove of the contact hole which corresponds to the protrusion. The width of groove 220 has a width of 100 nm, for example.

Figure 3B:
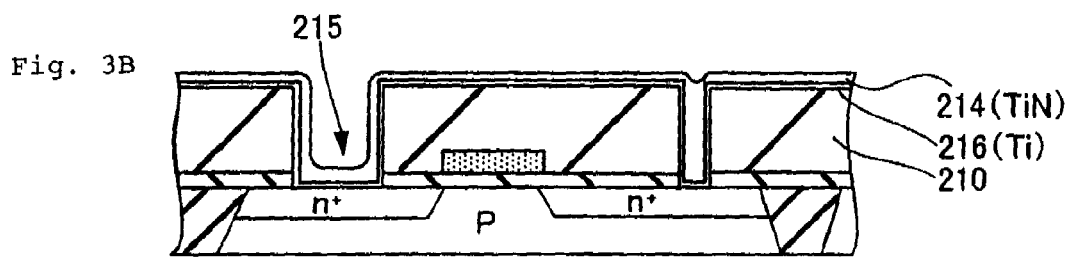

Then, as shown in FIG. 3B, Ti film 216 is deposited to a thickness of 15 nm and TiN film 214 is deposited to a thickness of 50 nm. At this time, narrower groove 220 is fully filled with a TiN/Ti film. In wider contact hole 218, only the bottom and side surfaces are covered with a TiN/Ti film. Although not shown, in the portion of contact hole 220 which corresponds to the main body of different-material contact plug 104, only the bottom and side surfaces are covered with a TiN/Ti film.

Figure 3C:
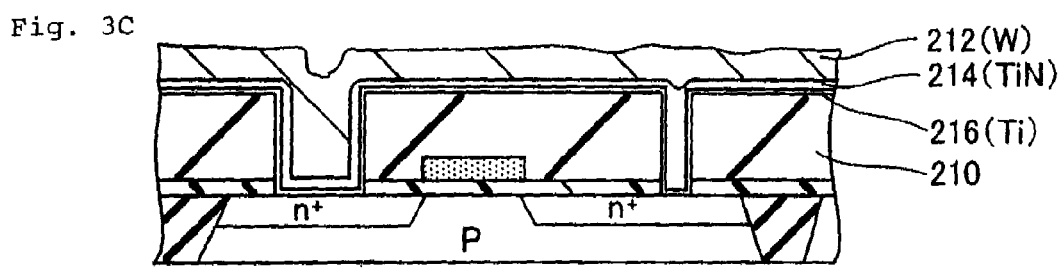
Figure 3D:
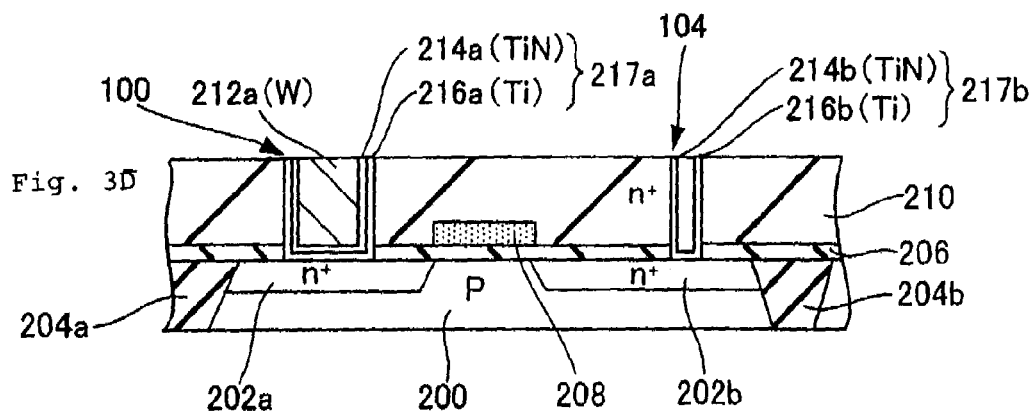

Then, as shown in FIG. 3C, a layer of tungsten (W) is deposited to a thickness of about 250 nm on the surface formed so far. Thereafter, as shown in FIG. 3D, the deposited layer of tungsten (W) and TiN/Ti films 214, 216 are continuously planarized by CMP, thereby forming ground potential plug 100 and different-material contact plug 104. In FIG. 3D, films 214a, 214b are collectively denoted by 217a, and films 214b, 216b are denoted by 217b.

Specific examples of the planar configuration of the different-material contact plug will be described below with reference to FIGS. 4A through 4D.

FIGS. 4A through 4D show planar configurations of different-material contact plugs. FIG. 4A shows a P-shaped different-material contact plug. FIG. 4B shows an L-shaped different-material contact plug. FIG. 4C shows a first protrusion type (T-shaped) contact plug. FIG. 4D shows a second protrusion type (I-shaped) contact plug.

As shown in FIGS. 4A through 4D, each of the different-material contact plugs comprises main body X1 and protrusion X2. Main body X1 has width L2 and protrusion X2 has width L1, which is sufficiently smaller than width L2.

In FIGS. 4A through 4D, a portion filled with TiN/Ti film 217 serves as the first electrically conductive material plug, and a portion filled with tungsten (W) film 212 serves as the second electrically conductive material plug. Thus, the different-material contact plug is a composite contact plug comprising first and second electrically conductive material plugs held in contact with each other through surfaces thereof.

4th Embodiment

In the fourth embodiment, the circuit arrangement of a phase-change memory device (phase-change memory IC), a layout of memory cells, a specific cross-sectional structure of a memory cell assembly, and a method of manufacturing same will be described below.

Figure 5:
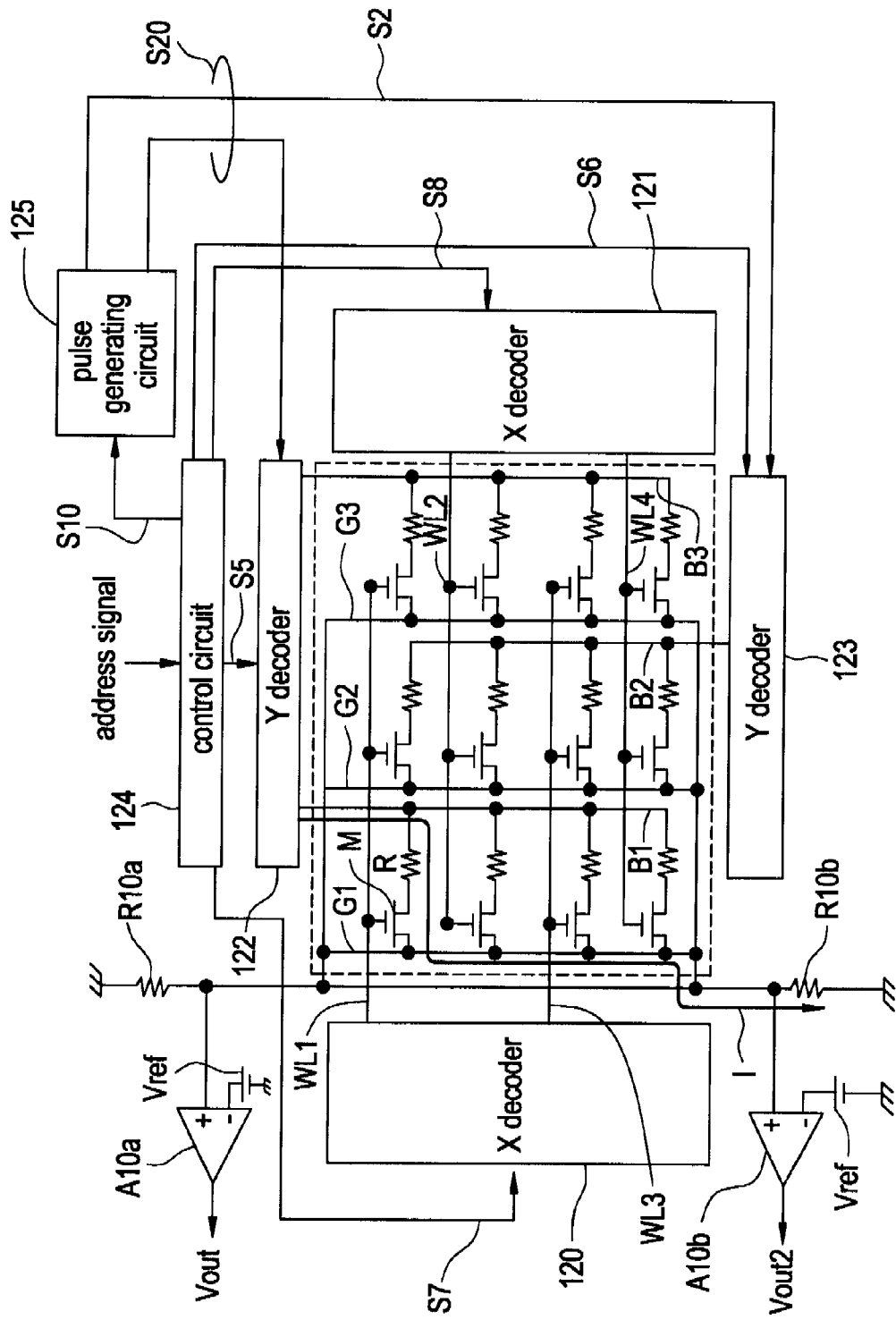
FIG. 5 is a circuit diagram showing an overall circuit arrangement of a phase-change memory device (phase-change memory IC) according to the present invention.

FIG. 5 is a circuit diagram showing an overall circuit arrangement of a phase-change memory device (phase-change memory IC) according to the present invention.

As shown in FIG. 5, a phase-change memory IC has a memory cell assembly disposed in a central area thereof. The memory cell assembly has a matrix of memory cells each comprising element selecting MOS transistor M and a phase-change memory device (represented as equivalent resistor R) according to the present invention.

The phase-change memory IC also has ground lines G1 through G3, word lines WL1 through WL4, and bit lines B1 through B3.

X decoders 120, 121 and Y decoders 122, 123 jointly make up an addressing circuit. X decoders 120, 121 energize word lines WL1 through WL4, and Y decoders 122, 123 energize bit lines B1 through B3.

Control circuit 124 generally controls operation of the phase-change memory IC. Control circuit 124 supplies control signals S5, S6, S7 and S8 to Y decoders 122, 123 and X decoders 120, 121, respectively, to individually control operation of X decoders 120, 121 and Y decoders 122, 123.

Pulse generating circuit 125 generates various pulse signals (setting, resetting, and reading pulse signals) S20 based on a control signal S10 from control circuit 124, and supplies generated pulse signals S20 to Y decoders 122, 123.

The phase-change memory IC also has operational amplifiers A10a, A10b as sense amplifiers, and current-to-voltage converting resistors R10a, R10b for converting a current I (indicated by the thick solid line in FIG. 5) into a voltage. A reference voltage Vref is applied to operational amplifiers A10a, A10b, which output respective detected signals (read-out signals) Vout1, Vout2 of the phase-change memory IC.

Figure 6:
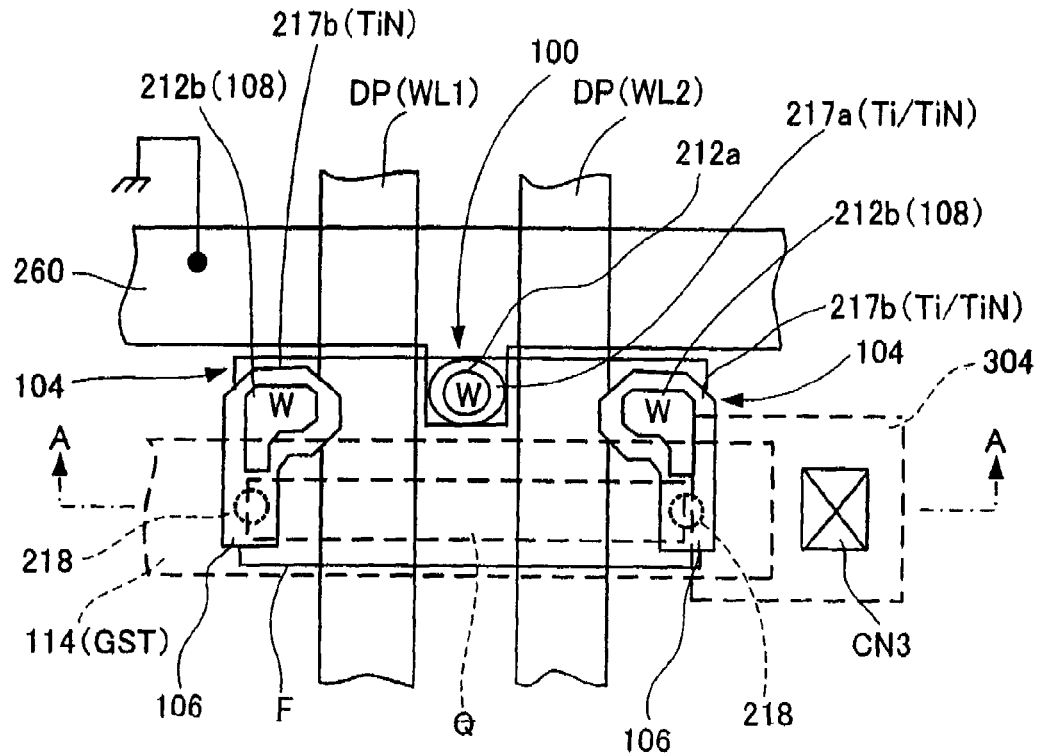
FIG. 6 a plan view showing by way of example a layout of elements and interconnects in a memory cell area of the phase-change memory device (phase-change memory IC) shown in FIG. 5.

FIG. 6 is a plan view showing, by way of example, a layout of elements and interconnects in a memory cell area of the phase-change memory device (phase-change memory IC)

shown in FIG. 5. Those parts in FIG. 6 which are identical to those shown in FIGS. 3A through 3D are denoted by identical reference characters.

In FIG. 6, ground potential plug 100 comprises first electrically conductive material plug 217a made of TiN/Ti and second electrically conductive material plug 212a made of tungsten (W).

Different-material contact plug 104 comprises first electrically conductive material plug 217b made of TiN/Ti and second electrically conductive material plug 212b made of tungsten (W) (which corresponds to second electrically conductive material plug 108 shown in FIG. 1). Different-material contact plug 104 has a P-shaped planar shape (see FIG. 4A).

In FIG. 6, a region F surrounded by the solid line is a field region (device forming region). Two vertical interconnects DP extend through the memory cell area. These vertical interconnects DP comprise respective doped silicon layers that servs as respective word lines WL1 through WL4 and doubles as the gate electrodes of MOS transistors.

GST film 114 serving as a phase-change layer extends horizontally through the memory cell area. Heater electrodes 218 are connected to GST films 114 in joint region Q which is free of an insulating film. Joint region Q extends between two adjacent heater electrodes 218 to provide a wide positioning margin, as described later.

Ground potential interconnect 260, which corresponds to ground lines G1 through G3 in FIG. 5, is made of tungsten (W) and connects ground potential plug 100 to ground.

Extension electrode layer 304 is connected to a portion of the bottom surface of phase-change layer 114 (GST). A contact plug is connected to extension electrode layer 304 through contact hole CN3.

A method of manufacturing the cross-sectional structure of the device taken along line A-A of FIG. 6 will be described below with reference to FIGS. 7 through 12. FIGS. 7 through 12 are cross-sectional views in major manufacturing steps, which are illustrative of a method of manufacturing the cross-sectional structure of the device taken along line A-A of FIG. 6.

Figure 7:
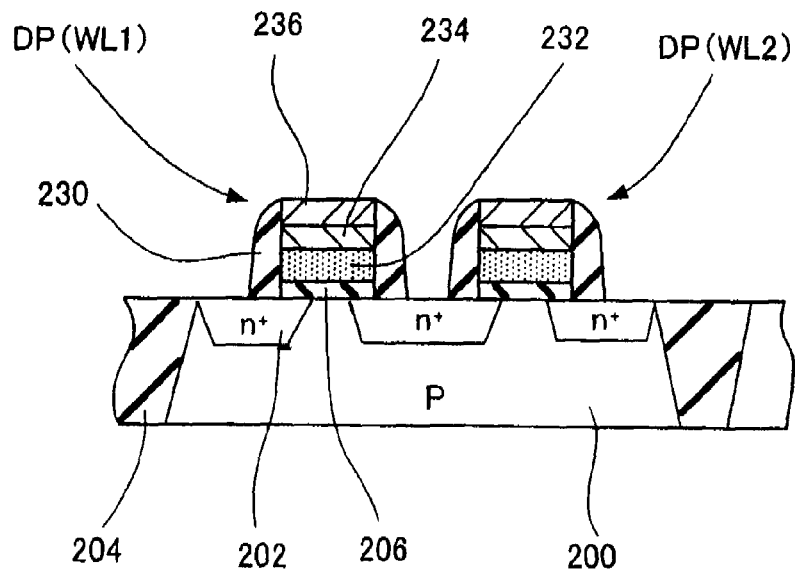
FIG. 7 is a cross-sectional view of a first manufacturing step which is illustrative of a method of manufacturing a cross-sectional structure of the device taken along line A-A of FIG. 6.

First step (FIG. 7):

As shown in FIG. 7, STIs (Shallow Trench Isolations) 204 are formed in p-type semiconductor substrate 200. A device forming region (field region) is surrounded by STIs 204. Gate insulating film 206 is deposited to a thickness of 7 nm, for example, on the surface of semiconductor substrate 200. Then, film 232 of doped silicon and film 234 of tungsten silicide are successively deposited to respective thicknesses of 100 nm, after which nitride film 236 is deposited. Then, a photolithographic mask is formed. Then, nitride film 236, film 234 of tungsten silicide, and film 232 of doped silicon are successively etched by anisotropic etching.

Then, a film of silicon nitride is formed on the entire surface of the semiconductor substrate, and side wall 230 is formed by anisotropic etching such as RIE (Reactive Ion Etching). The gate of the MOS transistor thus produced serves as word lines DP (WL1, WL2) in the circuit shown in FIG. 5.

Second Step (FIG. 8):

As shown in FIG. 8, interlayer insulating film 238 in the form of a TEOS oxide film is deposited to a thickness of 700 nm, and then planarized by CMP. Then, interlayer insulating film 238 is patterned to form contact hole (opening) 239a having an P-shaped planar shape (see FIGS. 6, 4A) for forming different-material contact plug 104 (the reference numeral 239a denotes a narrow groove of the contact hole which corresponds to the protrusion, and it will hereinafter be referred to as groove 239a). Naturally, a wider contact hole, not shown in FIG. 8, also referred to as opening 239b, is simultaneously formed in joined relation to groove 239a corresponding to the protrusion of the P-shaped contact hole.

Groove 239a has a width of 100 nm, for example, and groove 239b has a diameter of 200 nm, for example.

Although not shown in FIG. 8, when the P-shaped contact hole is formed, a contact hole having a circular planar shape is simultaneously formed for forming ground potential plug 100 (see FIG. 6).

Third step (FIG. 9):

The P-shaped contact hole and the circular contact hole for forming the ground potential plug are filled according to the steps shown in FIGS. 3A through 3D described above. Specifically, first, TiN/Ti film 217b is formed which includes a Ti film having a thickness of 15 nm and a TiN film having a thickness of 50 nm. At this time, groove 239a is fully filled with TiN/Ti film 217b. In wider contact hole 239b, only the bottom and side surfaces are covered with TiN/Ti film 217b. Then, a film of tungsten (W) is deposited to a thickness of about 250 nm. Thereafter, the film of tungsten (W) and the TiN/TN film are continuously planarized. In this manner, ground potential plug 100 comprising first electrically conductive material plug 217a and second electrically conductive material plug 212a, and different-material contact plug 104 comprising first electrically conductive material plug 217b and second electrically conductive material plug 212b are produced. Then, ground potential interconnect (ground interconnect) 260, not shown in FIG. 9, see FIG. 6, is formed on ground potential plug 100 which comprises first electrically conductive material plug 217a and second electrically conductive material plug 212a.

Then, interlayer insulating film 262, e.g., an HDP (High Density Plasma) oxide film, is formed. Then a contact hole having a width of 60 nm so that it can be filled with a heater electrode is formed in interlayer insulating film 262. Then, a titanium nitride (TiN) film is deposited by CVD. Tungsten (W) layer 271 as a main electrode layer of the extension electrode layer and titanium layer (Ti) layer 273 as a contact layer are formed on oxide film 264.

Fourth Step (FIG. 10):

A resist mask, not shown, is formed. Using the resist mask, titanium layer (Ti) layer 273 and tungsten (W) layer 271 are successively etched by dry etching, thereby forming extension electrode layer 116. The dry etching process is continued so as to pattern oxide film 264 to form opening Q therein.

It is to be noted that opening Q in oxide film 264 has a slanted (tapered) cross-sectional shape. The slanted (tapered) cross-sectional shape automatically keeps the end of extension electrode layer 304 and the exposed surface of heater electrode 218 spaced horizontally from each other by a predetermined distance "H". The horizontal spacing will be described in specific detail below.

The relative positional relationship between heater electrode 218 and the end of processed extension electrode layer 116 (271, 273) is very important. Specifically, extension electrode layer 116 (271, 273) should not obstruct good contact between heater electrode 218 and the phase-change layer (GST). However, if the end of extension electrode layer 116 (271, 273) is excessively spaced away from the contact surface between heater electrode 218 and the phase-change layer (GST), then the requirement for a reduced memory size cannot be met. The method of manufacturing the phase-change memory device according to the present invention employs a self-aligning positioning technique for automatically determining the relative positions of the heater electrode and the end of the extension electrode.

Figure 10:
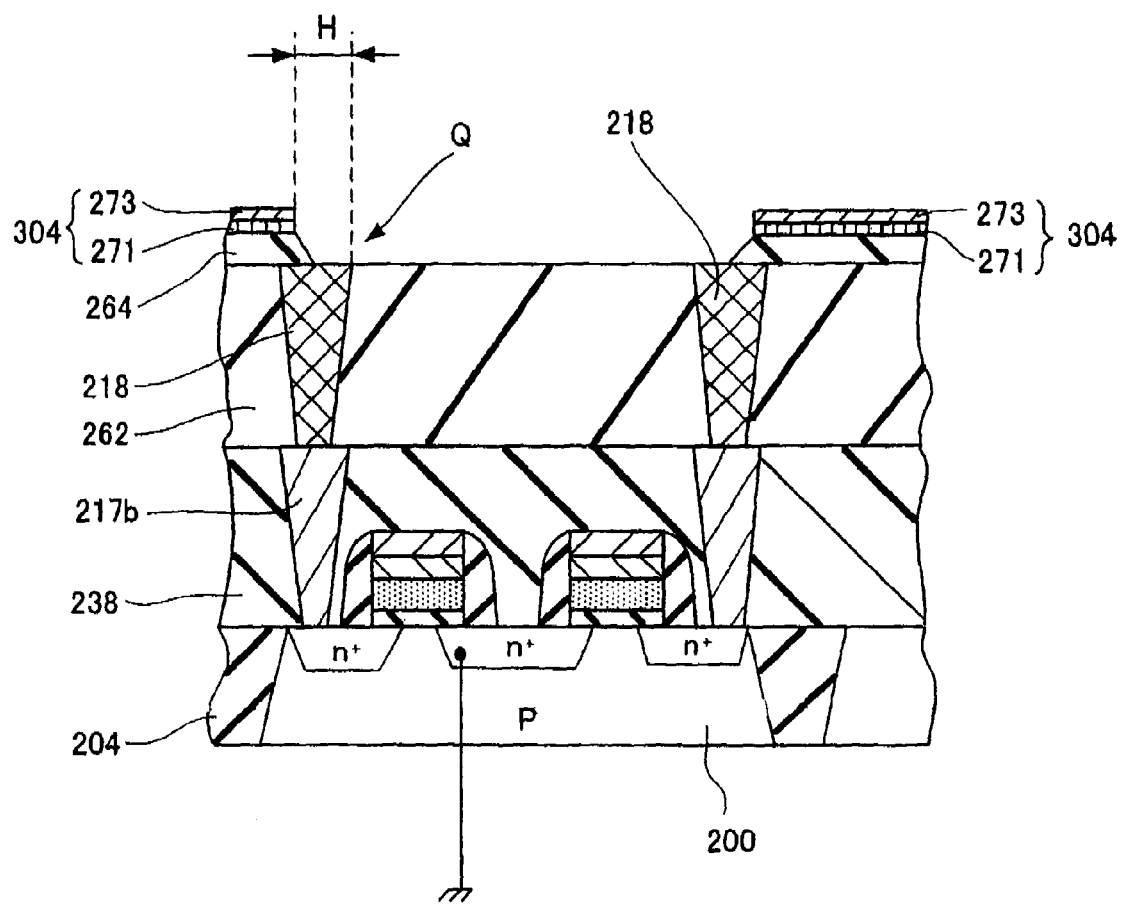
FIG. 10 is a cross-sectional view of a fourth manufacturing step which is illustrative of the method of manufacturing a cross-sectional structure of the device taken along line A-A of FIG. 6.

According to the self-aligning positioning technique, when extension electrode layer 304 and oxide film 264 are successively etched using a common mask, not shown in FIG. 10, since the etching rate for extension electrode layer 304 is higher, the processed portion of extension electrode layer 304 has a substantially vertical cross-sectional shape, and since the etching rate for oxide film 264 is lower, a reaction product formed upon etching is simultaneously deposited, causing the processed portion of oxide film 264 to have a tapered (slanted) cross-sectional shape. Therefore, the end of the surface of heater electrode 218 which is held in contact with the phase-change layer is spaced away from the end of extension electrode layer 304 by the distance "H" because of the processed end of oxide film 264 which projects horizontally as a slanted end. Consequently, the relative positional relationship between the end of extension electrode layer 304 and the surface of heater electrode 218 which is held in contact with the phase-change layer is automatically determined. As a result, the fabrication of a miniature phase-change memory device is facilitated without a positioning problem.

Another point to be noted in the step shown in FIG. 10 is that the constituent materials (271, 273) of extension electrode layer 304 can be patterned in the peripheral circuit area, making it possible to simultaneously form electrodes and interconnections. Specifically, extension electrode layer 304 is independent of the phase-change layer (GST) in the fabrication process. Therefore, when the extension electrode layer is formed in the memory cell area, electrodes and interconnections can simultaneously be formed in the peripheral circuit area. As a consequence, the fabrication process can be shared by the phase-change memory device and the peripheral circuit area, so that large-scale phase-change memory ICs can easily be fabricated.

Figure 11:
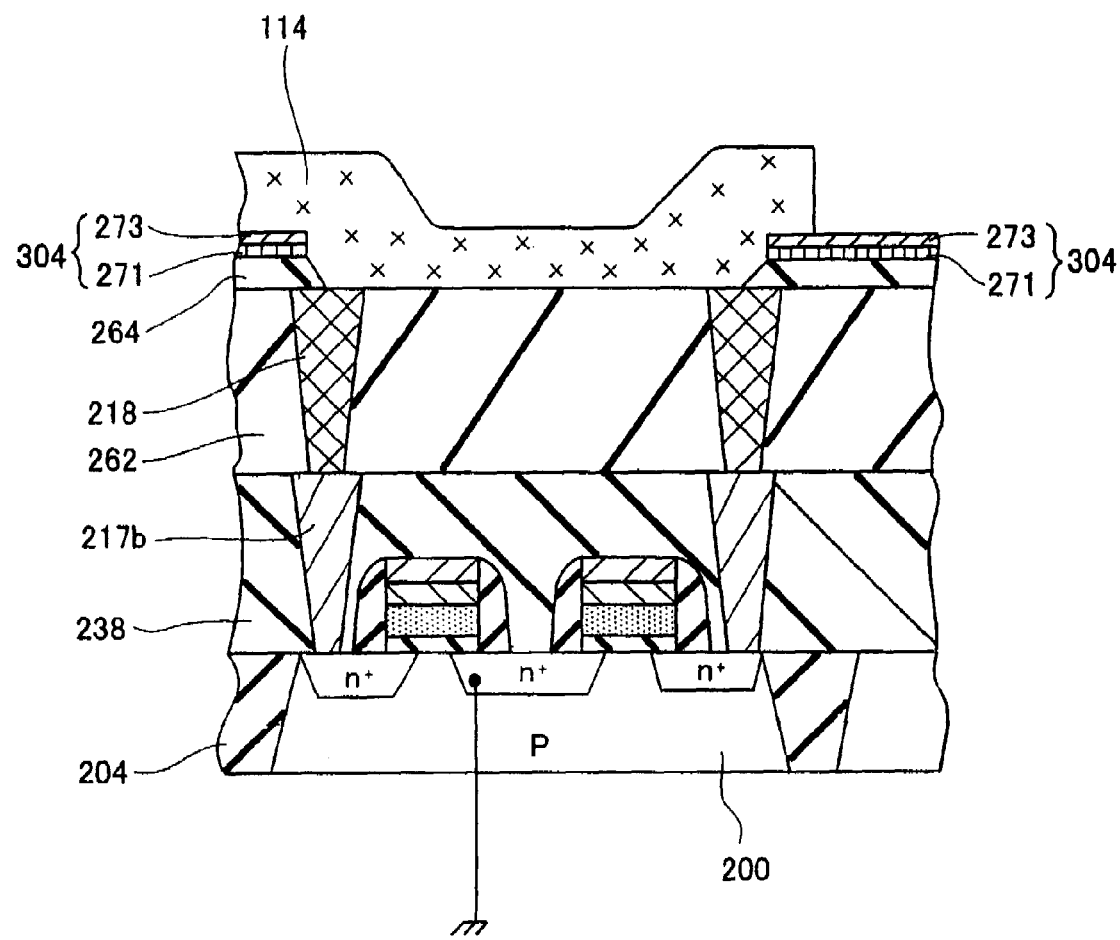
FIG. 11 is a cross-sectional view of a fifth manufacturing step which is illustrative of the method of manufacturing a cross-sectional structure of the device taken along line A-A of FIG. 6.

Fifth Step (FIG. 11):

In FIG. 11, phase-change layer (GST) 114 is deposited to a thickness of 100 nm, for example, on the entire surface of the semiconductor substrate by sputtering. Then, a processing mask, not shown, is formed on phase-change layer (GST) 114, and phase-change layer (GST) 114 is patterned using the processing mask. Thereafter, the processing mask is removed.

Figure 12:
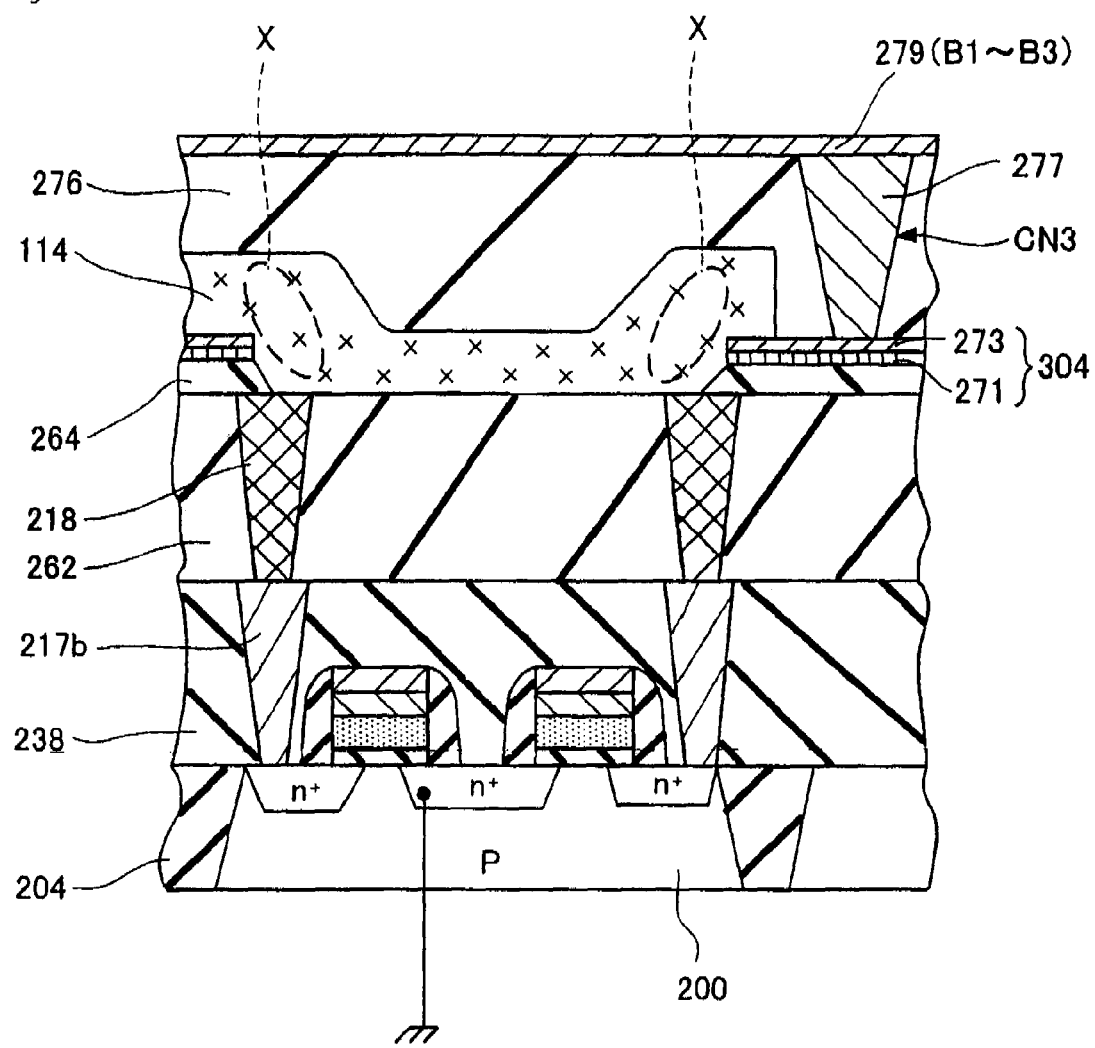
FIG. 12 is a cross-sectional view of a sixth manufacturing step which is illustrative of the method of manufacturing a cross-sectional structure of the device taken along line A-A of FIG. 6.

Sixth Step (FIG. 12):

In FIG. 12, interlayer insulating film 276 is formed, and contact holes are formed in interlayer insulating film 276. Contact plugs 277 are deposited in the contact holes, and then bit lines 279 made of tungsten (W) (corresponding to bit lines B1 through B3 in FIG. 5) are formed. In FIG. 12, areas surrounded by dotted line X represent phase-change areas.

In this manner, the phase-change memory device (phase-change memory IC) with the different-material contact plug and the extension electrode layer according to the present invention is completed.

5th Embodiment

A phase-change memory device having a different-material contact plug of a structure wherein the first and second electrically conductive material plugs are stacked in a common contact hole, according to the fifth embodiment, will be described below.

Figure 13:
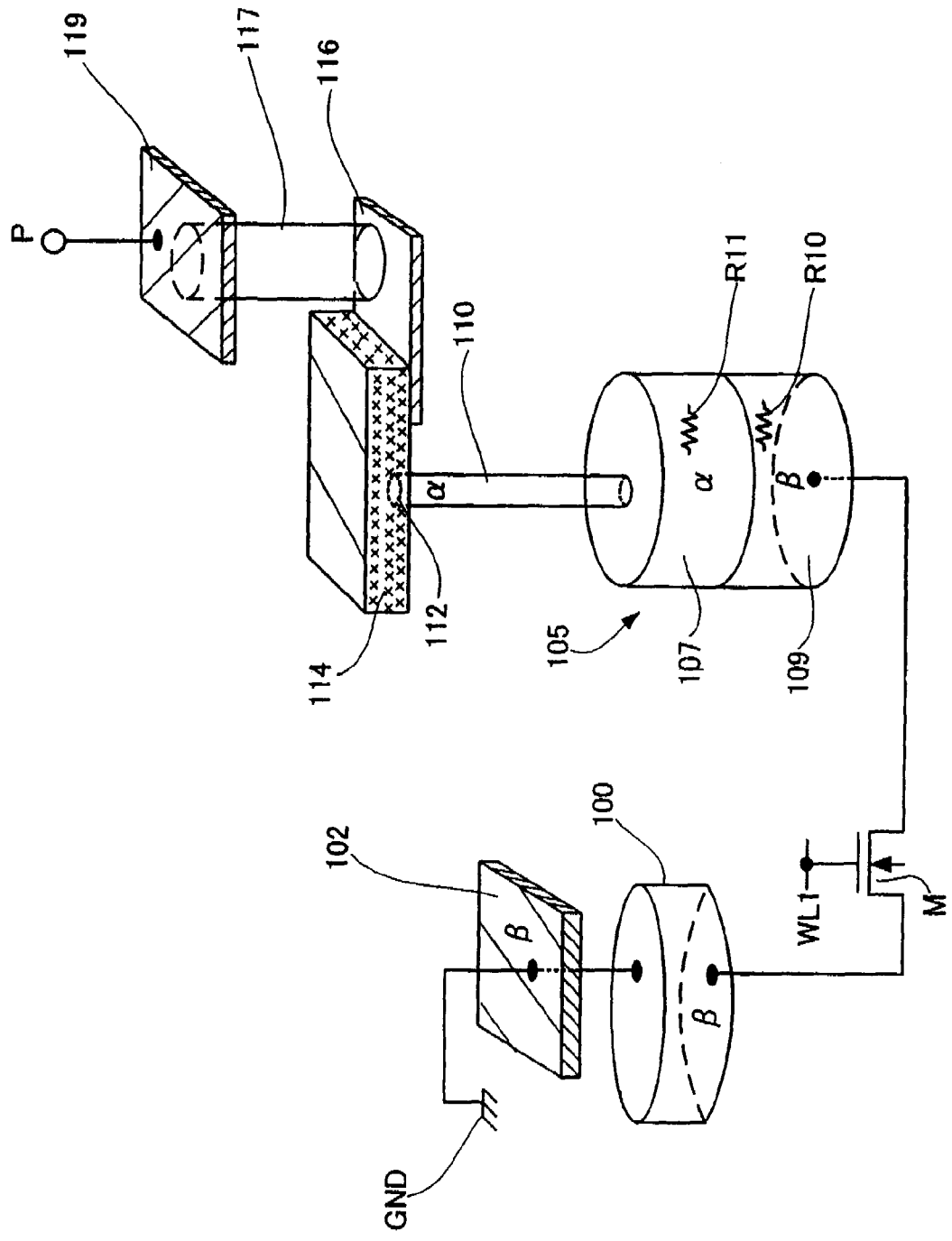
FIG. 13 is a view showing an essential structure of another phase-change memory device according to the present invention, the phase-change memory device having first and second electrically conductive material plugs stacked in a common contact hole.

FIG. 13 is a view showing another characteristic structure of a phase-change memory device according to the present invention, which has first and second electrically conductive material plugs stacked in a common contact hole.

The phase-change memory device shown in FIG. 13 differs from the phase-change memory device shown in FIG. 1A as regards the structure of different-material contact plug 105, and is identical to the phase-change memory device shown in FIG. 1A with respect to other details. The analysis of the different-material contact plug of the phase-change memory device shown in FIG. 1A, which is given according to the second embodiment, is also applicable to the phase-change memory device shown in FIG. 13.

As shown in FIG. 13, the phase-change memory device shown in FIG. 13 has first electrically conductive material plug 107 made of first electrically conductive material α and second electrically conductive material plug 109 made of second electrically conductive material β. Plugs 107, 109 are stacked one on the other. Specifically, plugs 107, 109 are formed in a stacked configuration. First electrically conductive material plug 106 has a bottom surface held in contact with an upper surface of second electrically conductive material plug 109. First and second electrically conductive material plugs 107, 109 have their side surfaces arranged so that they are not in contact with each other. Heater electrode 110 and second electrically conductive material plug 109 overlap each other. Specifically, second electrically conductive material plug 109 is present directly below heater electrode 110.

First electrically conductive material plug 107 has specific resistance R11, and second electrically conductive material plug 109 has specific resistance R10. Specific resistances R11, R10 are related to each other such that R11<R10.

Heater electrode 110, which is a lower electrode made of first electrically conductive material α, has a bottom surface held in contact with the upper surface of first electrically conductive material plug 107. Heater electrode 110 and first electrically conductive material plug 107 are made of the same material α, which can be considered as a material that can be used as the heater electrode. Therefore, heater electrode 110 and first electrically conductive material plug 107 provide a structure which is more resistant to the dissipation of heat transferred downwardly through heater electrode 110.

With different-material contact plug 105 according to the present invention, two plugs, i.e., the first and second electrically conductive material plugs, are stacked in one contact hole, but this does not mean that first and second plugs, that belong to different layers, are connected to each other. Accordingly, the number of layers is not increased, and the fabrication process is not made complex.

Since plugs 107, 109 are stacked one on the other, different-material contact plug 106 does not occupy a large area and this contributes to an increase in the degree of integration of the phase-change memory device. Since the problem of heat radiation beneath the heater electrode is solved, materials of low specific resistances can be selected more freely as electrode and interconnect materials in the other portions, so that a greater choice is available of materials that can be used.

6th Embodiment

According to the sixth embodiment, a method of manufacturing a different-material contact plug having stacked electrically conductive plugs as shown in FIG. 13 will be described below.

FIGS. 14A through 14E are cross-sectional views of device structures at major manufacturing steps, which are illustrative of a method of manufacturing a different-material contact plug according to the present invention.

Figure 14:
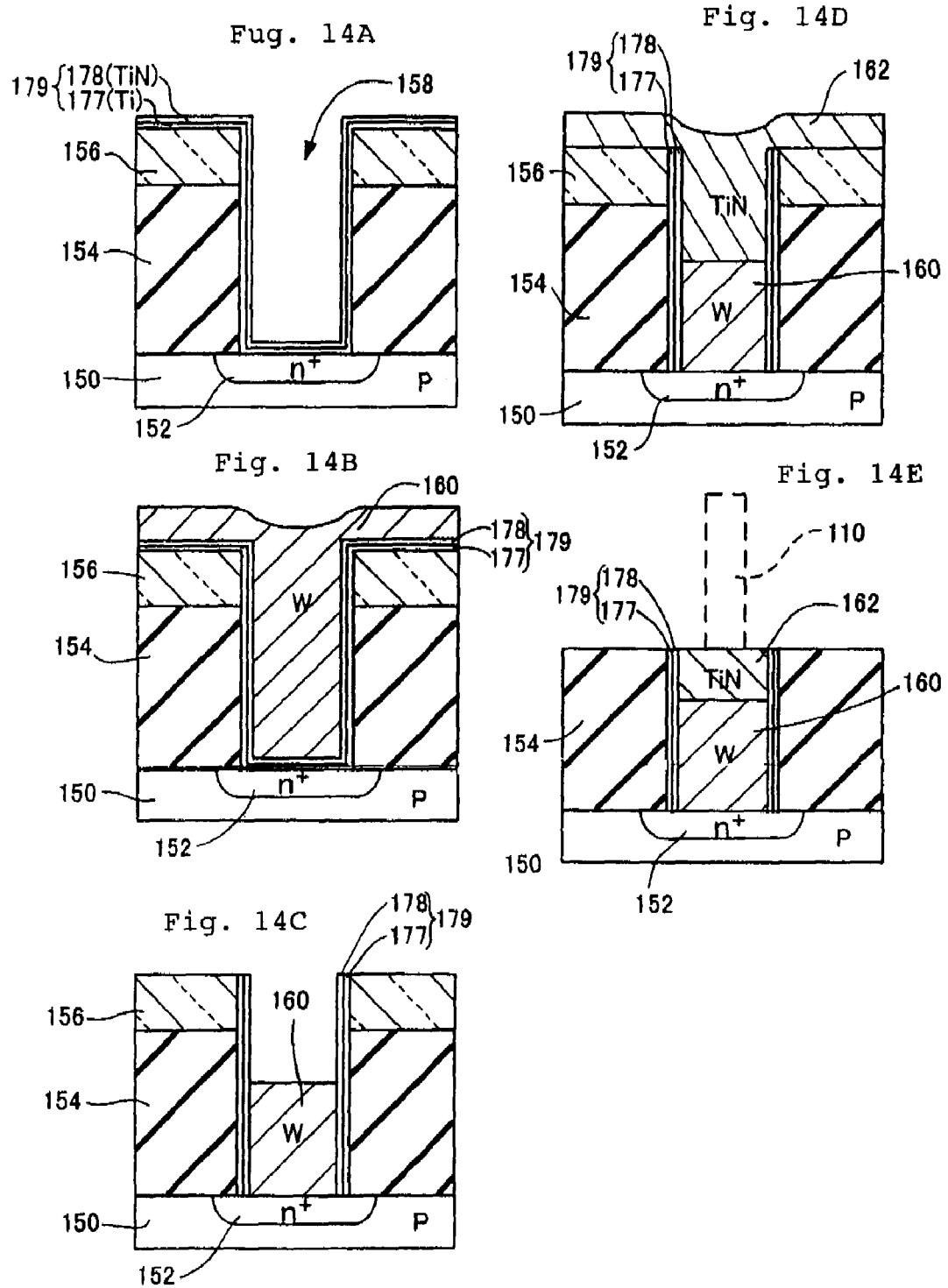
FIGS. 14A through 14E are cross-sectional views of device structures in major steps, which are illustrative of a method of manufacturing a different-material contact plug according to the present invention.

As shown in FIG. 14A, after n-type layer (which constitutes the drain layer of an NMOS transistor) 152 is formed in p-type semiconductor substrate 150, interlayer insulating film 154 is deposited thereon. Then, silicon nitride film ($Si_3N_4$) 156 is deposited and patterned. Using patterned silicon nitride film ($Si_3N_4$) 156 as a mask, contact hole 158 is formed in interlayer insulating film 154 by anisotropic dry etching.

Then, titanium (Ti) film 177 serving as a metal barrier and titanium nitride (TiN) film 178 are successively deposited on the surface formed so far. Ti film 177 has a thickness of 15 nm, and TiN film 178 has a thickness of 50 nm, for example. The metal barrier functions to provide a good ohmic contact between the contact plug and base silicon substrate 200.

In FIGS. 14A through 14E, titanium (Ti) film 177 and titanium nitride (TiN) film 178 are jointly indicated by reference numeral 179. In the description which follows, these films may also be referred to as "metal barrier 179".

Then, as shown in FIG. 14B, tungsten (S) film 160 of a second electrically conductive material is deposited to a thickness of about 250 nm on the surface formed so far by CVD.

Then, as shown in FIG. 14C, tungsten (W) film 160 is etched back to a thickness of about 300 nm by RIE (Reactive Ion Etching) using an $NH_3$ mixed gas until tungsten (W) film 160 has an upper surface lower than the upper surface of interlayer insulating film 154. In other words, a lower space in contact hole 158 is filled with tungsten (W), thereby forming second electrically conductive material plug 160 (denoted by 109 in FIG. 13) which is made of the second electrically conductive material.

Then, as shown in FIG. 14D, titanium nitride (TiN) film 162 of a first electrically conductive material is deposited on the surface formed so far.

Then, as shown in FIG. 14E, the surface formed so far is planarized by CMP (Chemical Mechanical Polishing) down to the upper surface of interlayer insulating film 154, embedding titanium nitride film 162 in an upper space in contact hole 158 thereby to form first electrically conductive material plug 162 (denoted by 107 in FIG. 13). First electrically conductive material plug 162 has a thickness of about 50 nm, for example.

Thereafter, heater electrode 110 (indicated by the dotted lines in FIG. 14E) is formed on first electrically conductive material plug 162 (denoted by 107 in FIG. 13).

Since high-resistance first electrically conductive material plug 162 is present directly below heater electrode 110, it is capable of suppressing heat radiation through heater electrode 110. As low-resistance second electrically conductive material plug 160 is present beneath first electrically conductive material plug 162, the overall equivalent resistance of the contact plug, i.e., the contact resistance with respect to the semiconductor substrate, is not increased. Therefore, even though the size (W/L) of the transistor, as a memory cell selecting element, is not increased, a required electric current is maintained and the phase-change memory device (phase-change memory IC) is reduced in size and increased in storage capacity.

In the different-material contact plug according to the present invention, two plugs (first and second plugs) 162, 160 are stacked in one contact hole, but this does not mean that first and second plugs, that belong to different layers, are connected to each other. Accordingly, the number of layers is not increased, and the fabrication process is not made complex.

7th Embodiment

Figure 15:
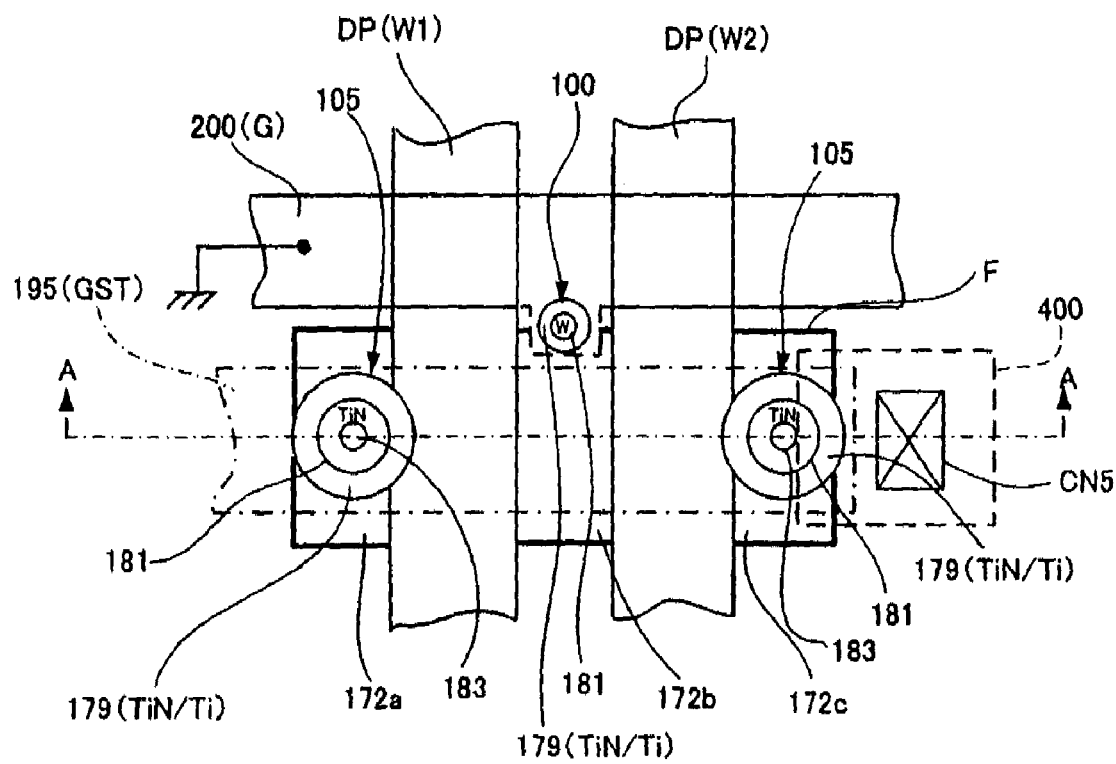
FIG. 15 is a plan view showing by way of example a layout of elements and interconnects in a memory cell area of the phase-change memory device (phase-change memory IC) having the structure shown in FIG. 13.

FIG. 15 is a plan view showing by way of example a layout of elements and interconnects in a memory cell area of the phase-change memory device (phase-change memory IC) shown in FIG. 13.

In FIG. 15, elongated rectangular region F surrounded by the thick solid line is a field region (device forming region) surrounded by the shallow trench isolation (STI).

Two vertical interconnects DP extending through the memory cell area comprise respective doped silicon layers serving as respective word lines W1, W2 and doubling as the gate electrodes of MOS transistors.

Each of horizontally spaced different-material contact plugs 105 comprises metal barrier 179 of TiN/Ti, titanium nitride (TiN) layer 181 serving as a first contact plug, and tungsten (W) layer 180, not shown in FIG. 15, serving as a second contact plug. Heater electrodes 183 are disposed on respective different-material contact plugs 105.

Similarly, central ground potential plug 100 comprises metal barrier 179 of TiN/Ti, titanium nitride (TiN) layer 181, and tungsten (W) layer 180, not shown in FIG. 15. Central ground potential plug 100 is manufactured in the same step as different-material contact plugs 105.

In FIG. 15, reference numeral 200 denotes ground interconnect G. Phase-change layer (GST layer) 195, which is shown as being surrounded by dot-and-dash lines in FIG. 15, extends horizontally in FIG. 15.

A manufacturing method will be described below.

Figure 16:
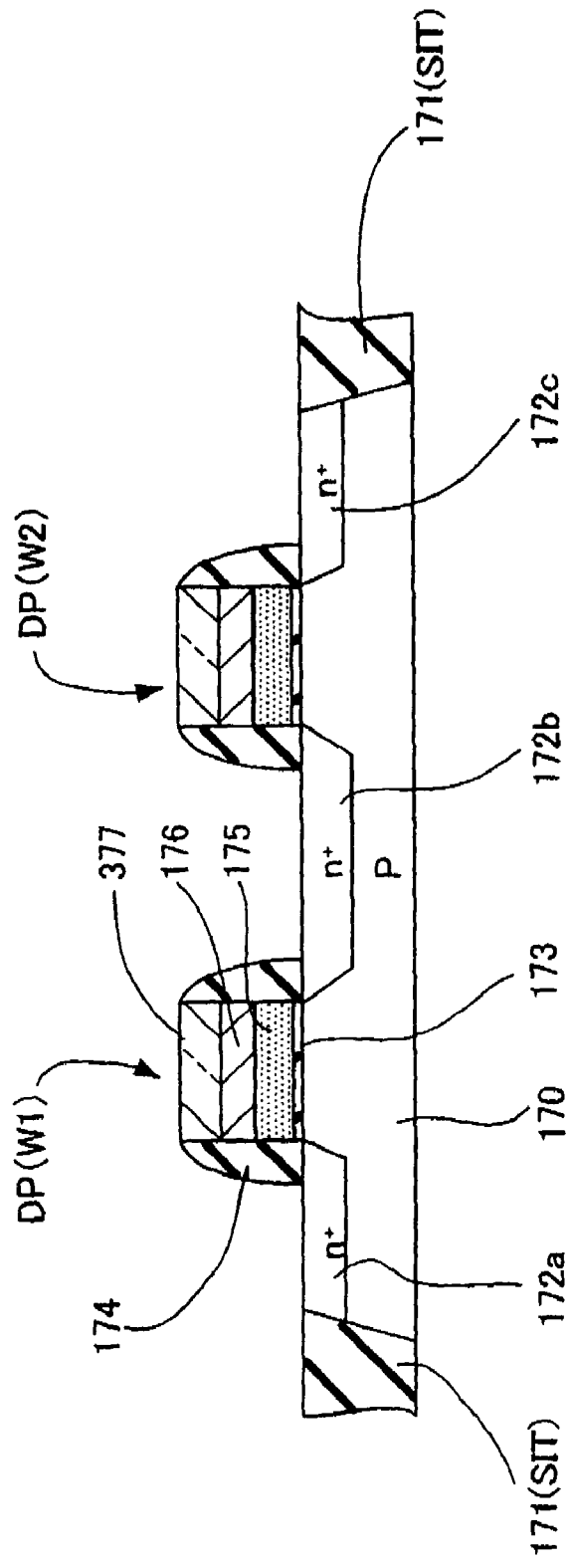
FIG. 16 is a cross-sectional view of a first step of a cross-sectional structure of the device taken along line A-A of FIG. 15.

First Step (FIG. 16):

FIG. 16 is a cross-sectional view taken along line A-A of FIG. 15, showing a structure produced in a first manufacturing step.

As shown in FIG. 16, after shallow trench isolations (STIs) 171, as element separating regions, are formed in p-type silicon substrate 170, gate oxide film 173 is deposited. Then, doped silicon layer 175 is deposited to a thickness of 100 nm, tungsten silicide layer 176 is deposited to a thickness of 100 nm, and silicon nitride film 377 is deposited to a thickness of 100 nm. Thereafter, a photoresist, not shown, is deposited and processed into an etching mask by photolithography. Then, silicon nitride film 377 is etched by anisotropic etching such as RIE (Reactive Ion Etching), after which the etching mask is removed. Then, using etched silicon nitride film 377 as a mask, tungsten silicide layer 176 and doped silicon layer 175 are successively etched to produce gate electrodes. Using the gate electrodes as a mask, phosphorus (p) ions are introduced into p-type silicon substrate 170 to from n-type diffused layers 172a, 172b. Then, a silicon nitride film is deposited to a thickness of 50 nm and then etched back by RIE, producing gate side walls 174.

The gates of the NMOS transistors thus formed correspond to word lines DP (W1, W2) shown in FIG. 15.

Figure 17:
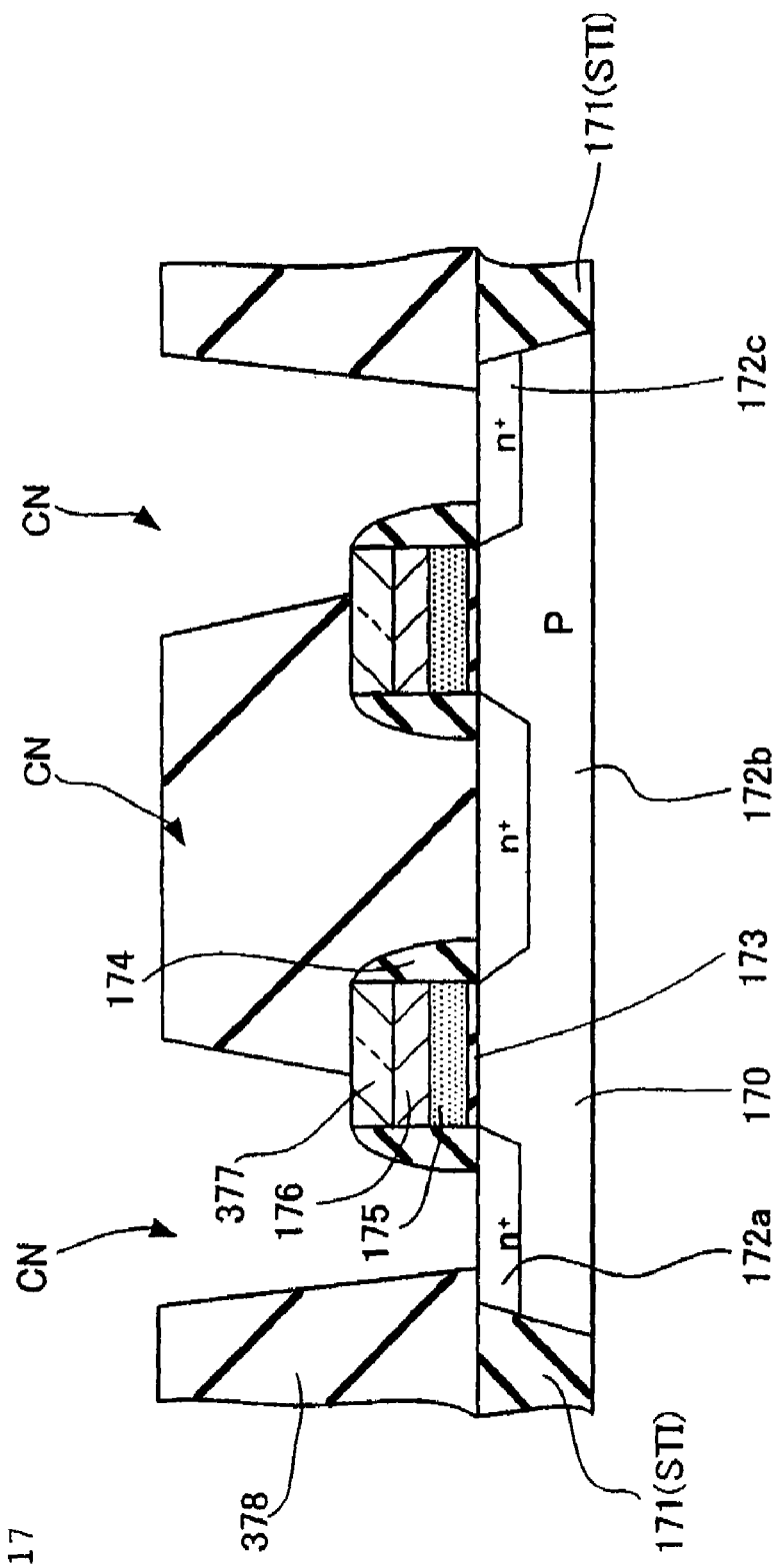
FIG. 17 is a cross-sectional view of a second step of a cross-sectional structure of the device taken along line A-A of FIG. 15.

Second Step (FIG. 17):

FIG. 17 is a cross-sectional view taken along line A-A of FIG. 15, showing a structure produced in a second manufacturing step.

As shown in FIG. 17, TEOS oxide film 378, as an interlayer insulating film, is deposited to a thickness of 700 nm, and then planarized by CMP. Then, contact holes CN are formed at given positions in interlayer insulating film (TEOS oxide film) 378 by photolithography. At this time, interlayer insulating film 378 is etched using a silicon nitride film as a mask under selective etching conditions.

Figure 18:
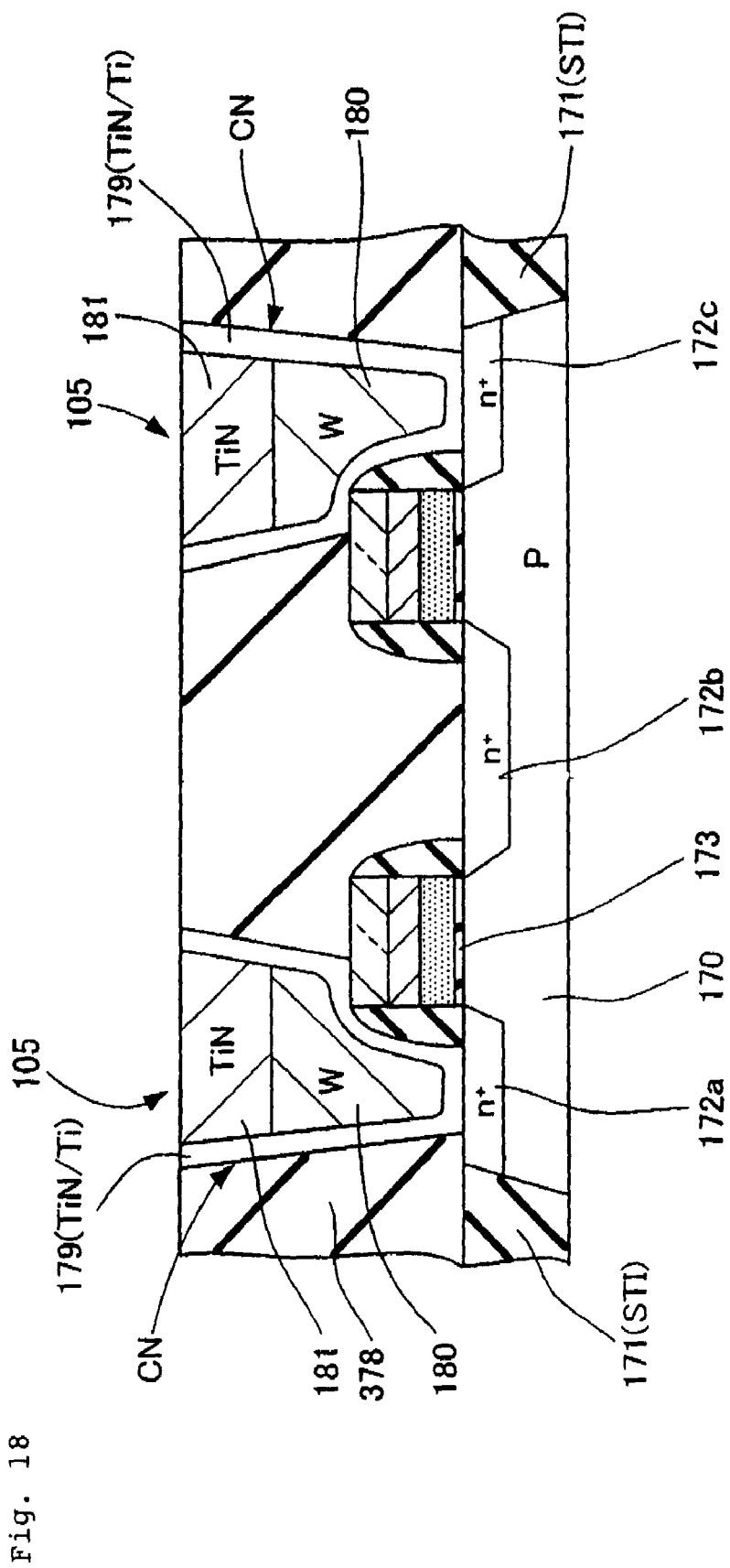
FIG. 18 is a cross-sectional view of a third step of a cross-sectional structure of the device taken along line A-A of FIG. 15.

Third Step (FIG. 18):

FIG. 18 is a cross-sectional view taken along line A-A of FIG. 15, showing a structure produced in a third manufacturing step.

In the third step, in order to form metal barrier 179, a Ti film and a TiN film are successively deposited to a thickness of 10 nm and a thickness of 15 nm, respectively. Then, tungsten (W) film 180 of a second electrically conductive material is deposited to a thickness of 250 nm. Then, as shown in FIG. 14C, tungsten (W) film 180 is etched back by RIE using an $SF_6/O_2$ mixed gas until tungsten (W) film 180 has an upper surface lower than the upper surface of interlayer insulating film 378. In other words, a lower space in contact hole CN is filled with tungsten ON), thereby forming second electrically conductive material plug 180 which is made of the second electrically conductive material. Then, as shown in FIG. 14D, titanium nitride (TiN) film 181 of a first electrically conductive material is deposited to a thickness of 50 nm on second electrically conductive material plug 180. Then, as shown in FIG. 14E, the surface formed so far is planarized by CMP down to the upper surface of interlayer insulating film 378, embedding titanium nitride film 181 in an upper space in contact hole CN thereby to form first electrically conductive material plug 181 of the first electrically conductive material. In this manner, different-material contact plug 105 and ground potential plug 100 are formed. Then, ground interconnect 200 (G) (not shown in FIG. 18) of tungsten ON) is deposited on ground potential plug 100.

As described above, in different-material contact plug 105, two plugs (first and second plugs) 181, 180 are stacked in one contact hole CN, but this does not mean that first and second plugs, that belong to different layers, are connected to each other. Accordingly, the number of layers is not increased, and the fabrication process is not made complex. Since plugs 181, 180 are stacked one on the other, use of the different-material contact plug does not increase the area occupied by the different-material contact plug.

Figure 19:
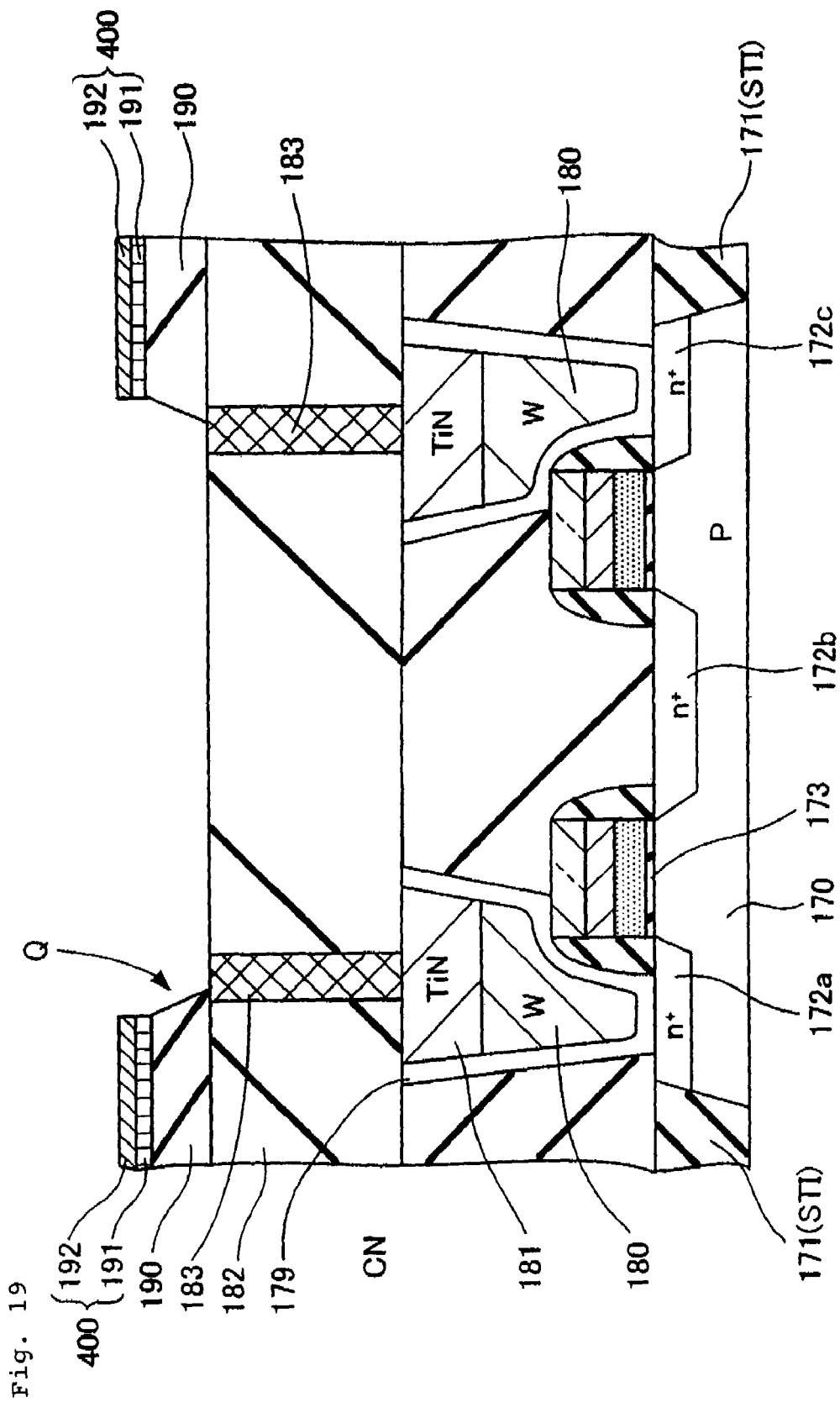
FIG. 19 is a cross-sectional view of a fourth step of a cross-sectional structure of the device taken along line A-A of FIG. 15.

Fourth Step (FIG. 19):

FIG. 19 is a cross-sectional view taken along line A-A of FIG. 15, showing a structure produced in a fourth manufacturing step.

As shown in FIG. 19, HDP (High Density Plasma) film 182, as an interlayer insulating film, is deposited on the surface formed so far, and contact holes each for embedding heater electrode 183 therein are formed in HDP film 182. TiN is buried in the contact hole, thereby forming heater electrode 183.

Heater electrode 183 has a bottom surface connected to the upper surface of first electrically conductive material plug (TiN) 181 of different-material contact plug 105.

Since first electrically conductive material plug 181 of high resistance is present directly below heater electrode 183, it suppresses the radiation of heat transferred through heater electrode 183. As second electrically conductive material plug 180 having low resistance is present beneath first electrically conductive material plug 181, the overall equivalent resistance (contact resistance) of the contact plug is not increased. Therefore, even though the size (W/L) of the NMOS transistor as a memory cell selecting element is not increased, the required electric current is maintained and the phase-change memory device (phase-change memory IC) is reduced in size and increased in storage capacity.

Oxide film 190 is deposited on HDP film 182 by CVD, after which tungsten (W) layer 191 as a main electrode layer of extension electrode layer 400 and titanium (Ti) film 191 as a contact layer are deposited. Then, using a common mask, extension electrode layer 400 and oxide film 190 are successively patterned to form an opening Q.

Figure 20:
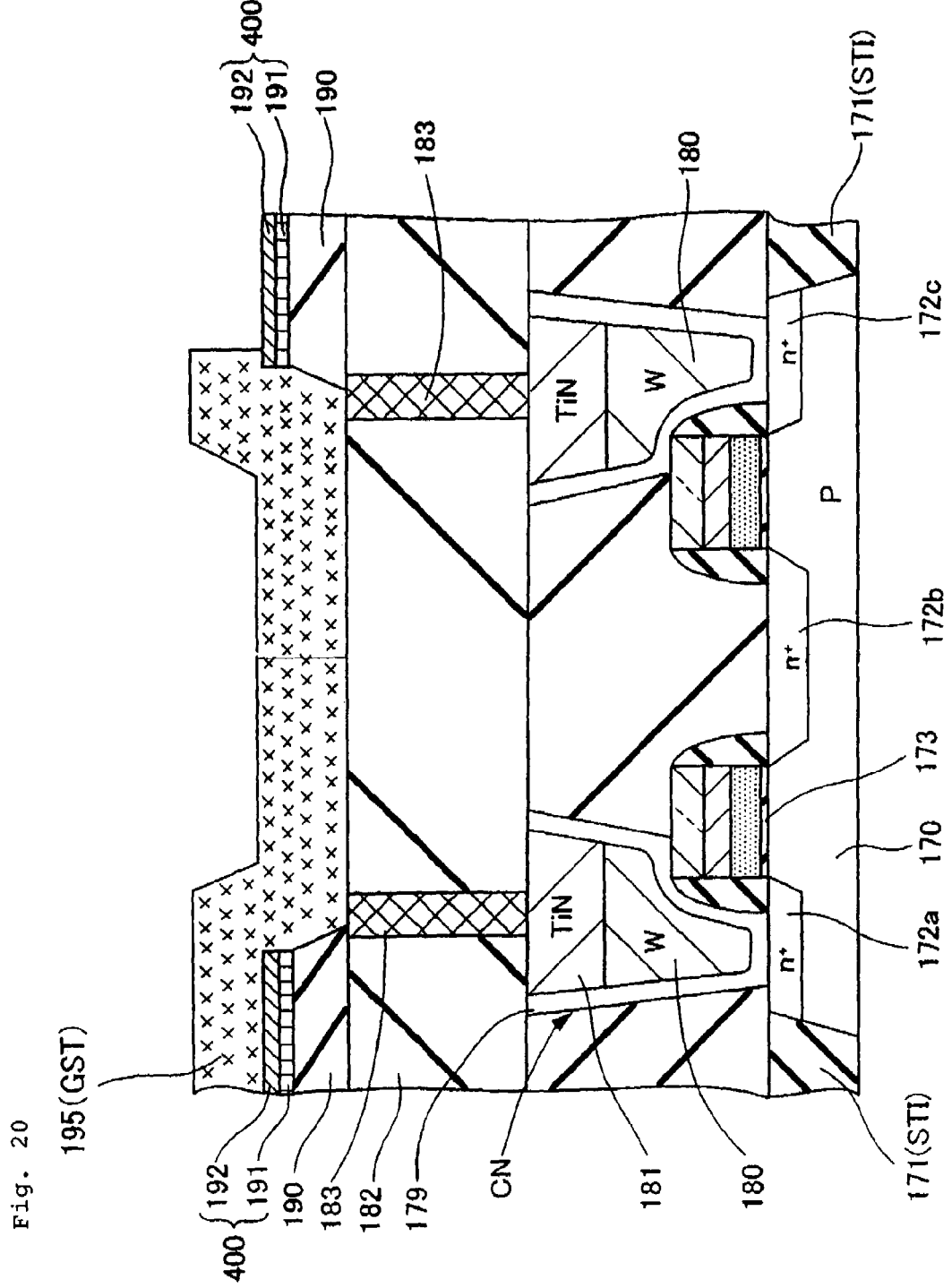
FIG. 20 is a cross-sectional view of a fifth step of a cross-sectional structure of the device taken along line A-A of FIG. 15.

Fifth Step (FIG. 20):

FIG. 20 is a cross-sectional view taken along line A-A of FIG. 15, showing a structure produced in a fifth manufacturing step.

As shown in FIG. 20, phase-change layer (GST) 195 is formed and then patterned.

Figure 21:
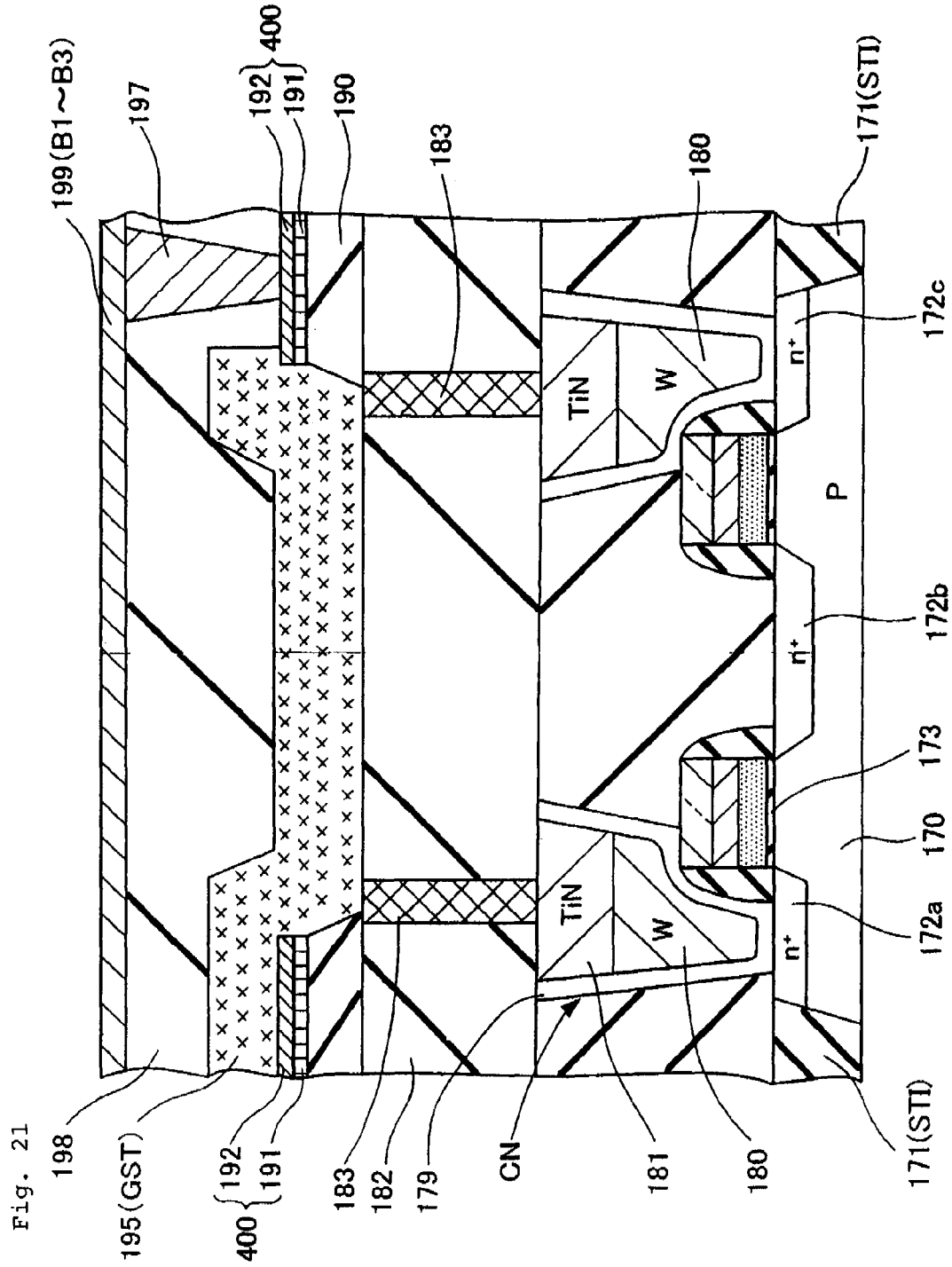
FIG. 21 is a cross-sectional view of a sixth step of a cross-sectional structure of the device taken along line A-A of FIG. 15.

Sixth Step (FIG. 21):

FIG. 21 is a cross-sectional view taken along line A-A of FIG. 15, showing a structure produced in a sixth manufacturing step.

As shown in FIG. 21, interlayer insulating film 198 is formed on phase-change layer (GST) 195, and a contact hole is formed in interlayer insulating film 198. Then, contact plug 198 is deposited in the contact hole, and tungsten (W) layer 199 is deposited which provides bit lines B1 through B3 in the circuit arrangement shown in FIG. 5.

In this manner, the phase-change memory device having the structure shown in FIG. 13 is completed.

Although the preferred embodiments of the present invention have been described above, the present invention is not limited to the illustrated embodiments, and various changes and modifications may be made therein without departing from the scope of the present invention.

For example, MOS transistors of memory cells may be replaced with various switching elements such as bipolar transistors, junction diodes, Schottky barrier diodes, or the like.

Figure 23:
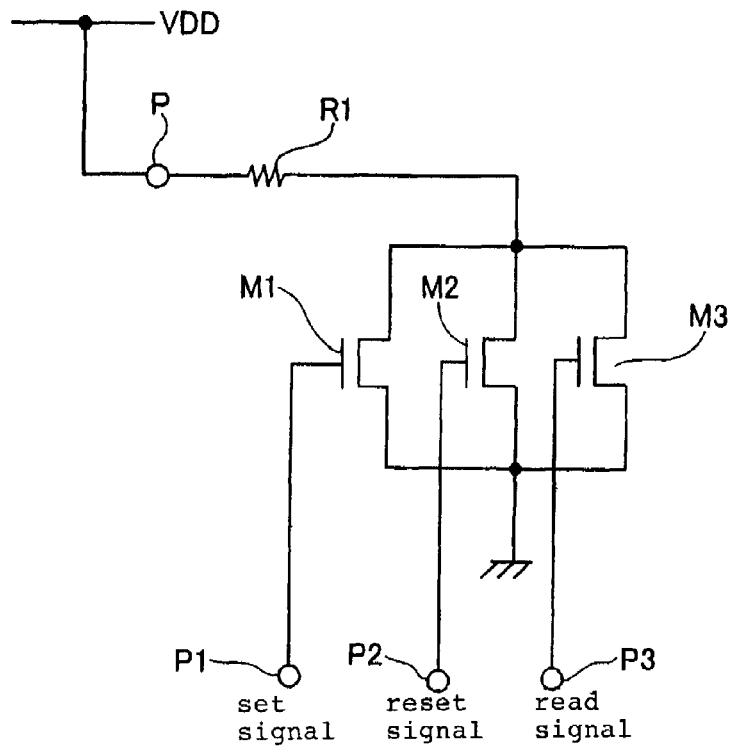
FIG. 23 is a circuit diagram of a circuit arrangement of the phase-change memory device.
Figure 24:
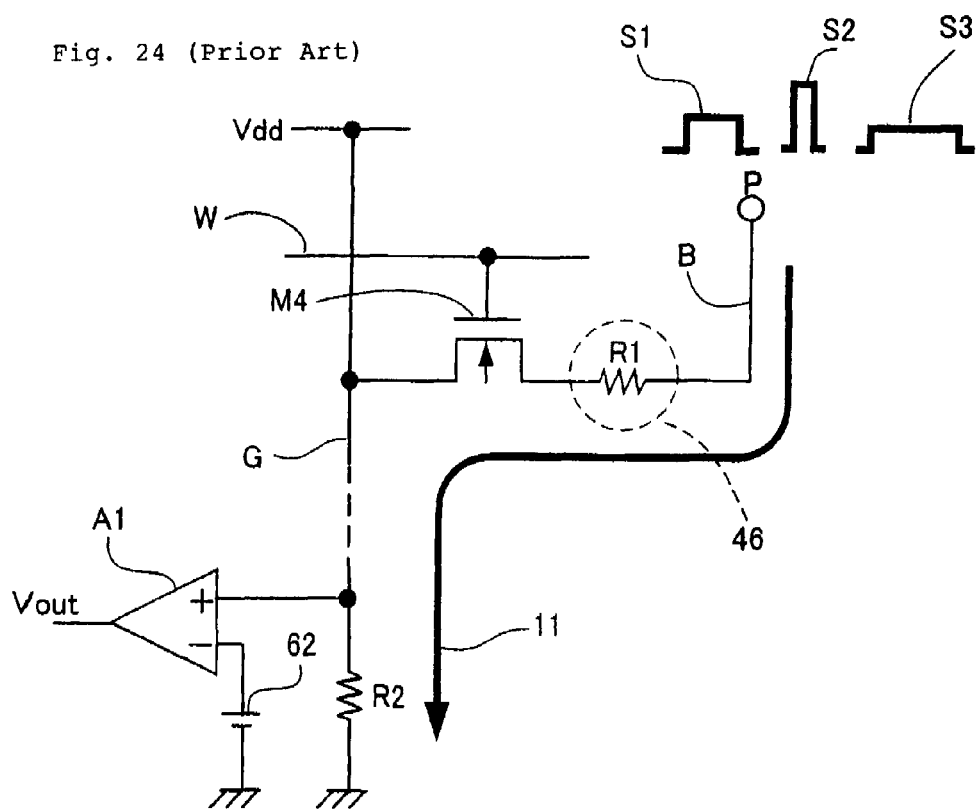
FIG. 24 is a circuit diagram showing the manner in which a phase-change memory device (phase-change memory IC) operates in a reading mode.

The phase-change layer may be made of a material other than the chalcogenide semiconductor. The phase-change memory IC may have the circuit arrangement shown in FIG. 23 in which pulses having different waveforms are not input, but differently sized transistors are selectively turned on to draw a current.

What is claimed is:

1. A phase-change memory device comprising:
a different-material contact plug having a first electrically conductive material plug made of a first electrically conductive material, and a second electrically conductive material plug made of a second electrically conductive material having a specific resistance smaller than said first electrically conductive material, said first electrically conductive material plug and said second electrically conductive material plug being embedded in a common contact hole;
a heater electrode having one end connected to said first electrically conductive material plug;
a phase-change layer having a bottom surface including a portion connected to the other end of said heater electrode;
an extension electrode layer held in contact with a portion of the bottom surface of said phase-change layer in an area displaced off a position directly above a contact surface through which said phase-change layer and said heater electrode contact each other; and
a contact electrode connected to a portion of an upper surface of said extension electrode layer.

2. The phase-change memory device according to claim 1, wherein said first electrically conductive material plug and said second electrically conductive material plug are held in contact with each other through at least respective side surfaces thereof, and said heater electrode and said second electrically conductive material plug do not overlap each other.

3. The phase-change memory device according to claim 1, wherein said first electrically conductive material plug and said second electrically conductive material plug are stacked in said contact hole, and said heater electrode and said second electrically conductive material plug overlap each other.

4. The phase-change memory device according to claim 1, wherein said first electrically conductive material comprises a metal, a nitride of a metal, or a silicide of a metal, the metal being any one of titanium (Ti), tantalum (Ta), molybdenum (Mo), niobium (Nb), zirconium (Zr), and tungsten (W).

5. The phase-change memory device according to claim 1, wherein said first electrically conductive material comprises titanium nitride (TiN), tantalum nitride (TaN), a molybdenum nitride (MoN), niobium nitride, titanium silicon nitride, titanium aluminum nitride, titanium boron nitride, zirconium-silicon nitride, tungsten-silicon nitride, tungsten-boron nitride, zirconium-aluminum nitride, molybdenum-silicon nitride, molybdenum-aluminum nitride, tantalum-silicon nitride, tantalum-aluminum nitride, titanium oxynitride, titanium aluminum oxynitride, tungsten oxynitride, tantalum oxynitride, tantalum silicide (TaSi), tungsten silicide (WSi), or molybdenum silicide (MoSi).

6. The phase-change memory device according to claim 1, wherein said second electrically conductive material comprises a metal selected from the group consisting of tungsten (W), aluminum (Al), molybdenum (Mo), and copper (Cu), or a silicide of the metal.

7. The phase-change memory device according to claim 1, wherein the specific resistance of said first electrically conductive material is at least 10 times the specific resistance of said second electrically conductive material.

8. The phase-change memory device according to claim 1, further comprising:
an insulating film in which said heater electrode is embedded; and
an insulating film disposed on said insulating film and patterned to expose at least a portion of an upper surface of said heater electrode;
wherein said extension electrode layer has a predetermined pattern and is formed on the patterned insulating film, and said phase-change layer is disposed in covering relation to a portion of said extension electrode layer and the exposed portion of the upper surface of said heater electrode.

9. The phase-change memory device according to claim 1, wherein said extension electrode layer comprises a main electrode layer and a contact layer disposed between said main electrode layer and said phase-change layer for better contact between said extension electrode layer and said phase-change layer.

10. A memory device comprising:
a transistor having a pair of regions defining a channel therebetween and a gate structure covering the channel with an intervention of a gate insulating film therebetween;
a first insulating layer covering the transistor, the insulating layer having a hole selectively formed therein and a substantially planer surface;
a conductive plug filling the hole of the insulating layer with an electrical connection with one of the region and having an upper surface that is substantially coplanar with the planer surface of the first insulating layer, the contact plug comprising a first conductive material and a second conductive material that generate heat greater than the first conductive material;
a second insulating layer covering the first insulating layer and the conductive film;
a heater electrode selectively formed in the second insulating film in contact with the second conductive material and apart from the first conductive material; and
a phase-change layer provided in contact with the heater electrode.

11. The device as claimed in claim 10, wherein the first conductive material forms a part of the upper surface of the conductive plug and the second conductive material forms another part of the upper surface of the conductive plug.

12. The device as claimed in claim 10, wherein the first and second conductive materials are stacked with each other so that the second conductive material forms a substantial whole of the upper surface of the conductive plug.

13. The device as claimed in claim 10, further comprising a third insulating layer covering the heater electrode and the second insulating layer, the third insulating layer having an opening that exposes a part of the heater electrode with a remaining part of the heater electrode being kept covered by the third insulating layer, the phase-change layer being thereby in contact with the part of the heater electrode exposed the opening of the third insulating layer.

14. The device as claimed in claim 13, further comprising a conductive layer formed on an upper surface of the third insulating layer, the phase-change layer being extended over the conductive layer in contact therewith from the part of the heater electrode.

15. The device as claimed in claim 10, further comprising an additional conductive plug formed in the first insulating layer with an electrical connection with the other of the regions of the transistor.

16. The device as claimed in claim 15, wherein the additional conductive plug has the first and second conductive materials.

* * * * *

UNITED STATES PATENT AND TRADEMARK OFFICE
CERTIFICATE OF CORRECTION

PATENT NO. : 7,755,075 B2  Page 1 of 1
APPLICATION NO. : 11/678484
DATED : July 13, 2010
INVENTOR(S) : Tsutomu Hayakawa It is certified that error appears in the above-identified patent and that said Letters Patent is hereby corrected as shown below:

Column 17, line 14, delete "material a of first" and insert --material α of first--

Column 17, line 44, delete "material a should" and insert --material α should--

Column 29, line 16, delete "with tungsten ON)" and insert --with tungsten (W)--

Column 29, line 29, delete "with tungsten ON)" and insert --with tungsten (W)--

Signed and Sealed this

Twenty-sixth Day of October, 2010

David J. Kappos
*Director of the United States Patent and Trademark Office*